US012531515B2

United States Patent
Yuzurihara et al.

(10) Patent No.: US 12,531,515 B2
(45) Date of Patent: Jan. 20, 2026

(54) DRIVER DEVICE FOR CLASS-D FULL BRIDGE AMPLIFIER

(71) Applicant: KYOSAN ELECTRIC MFG. CO., LTD., Yokohama (JP)

(72) Inventors: Itsuo Yuzurihara, Yokohama (JP); Satoshi Aikawa, Yokohama (JP); Tadaharu Ohno, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 641 days.

(21) Appl. No.: 17/915,149

(22) PCT Filed: Mar. 17, 2021

(86) PCT No.: PCT/JP2021/010925
§ 371 (c)(1),
(2) Date: Sep. 28, 2022

(87) PCT Pub. No.: WO2021/200173
PCT Pub. Date: Oct. 7, 2021

(65) Prior Publication Data
US 2023/0112281 A1  Apr. 13, 2023

(30) Foreign Application Priority Data
Mar. 31, 2020  (JP) ................................ 2020-064344

(51) Int. Cl.
*H03F 1/02* (2006.01)
*H03F 3/217* (2006.01)

(52) U.S. Cl.
CPC ........... *H03F 1/0211* (2013.01); *H03F 3/217* (2013.01)

(58) Field of Classification Search
CPC ...... H03F 1/0211; H03F 3/217; H03F 3/2173; H02M 7/5387; H02M 3/33573;
(Continued)

(56) References Cited

U.S. PATENT DOCUMENTS 6,016,258 A * 1/2000 Jain .......................... H02M 1/38
363/17
6,370,047 B2 * 4/2002 Mallory ................ H02M 7/493
363/71
(Continued)

FOREIGN PATENT DOCUMENTS

EP  3522373 A1  8/2019
JP  2002-119053 A  4/2002
(Continued)

OTHER PUBLICATIONS

Office Action dated Sep. 5, 2023, issued in counterpart JP application No. 2020-064344, with English translation. (14 pages).
(Continued)

*Primary Examiner* — Hieu P Nguyen
(74) *Attorney, Agent, or Firm* — WHDA, LLP

(57) ABSTRACT

The present invention suppresses unevenness of an input/output current of a full bridge circuit, which is caused due to a cross current generated by a delay operation or the like of a switching element and unevenness of a driver voltage of each switching element, and suppresses an occurrence of an erroneous operation of an amplifier of a class-D full bridge circuit. A driver device of a class-D full bridge amplifier according to the present invention sets, at the same potential in terms of DC, reference potentials on a low-voltage side of two high-side driver circuits which drive two high-side switching elements which constitute a full bridge circuit, and suppresses an occurrence of unevenness of a driver voltage of the switching elements due to a cross current which flows between the bridge circuit and the high-side driver circuits. In the configuration in which a plurality of class-D full bridge amplifiers are driven, a driver power supply is individually provided to driver circuits which drive the class-D full bridge amplifiers, and cross currents which (Continued)

flow between the plurality of class-D full bridge amplifiers are suppressed.

5 Claims, 16 Drawing Sheets

(58) Field of Classification Search
CPC ............ H02M 1/08; H02M 3/28; H02M 7/48; H03K 2217/0045; H03K 2217/0081; H03K 17/165
USPC .............................. 330/251, 10, 207 A, 297
See application file for complete search history.

(56) References Cited

U.S. PATENT DOCUMENTS

| 9,812,971 | B1 * | 11/2017 | Tschirhart ............. H02M 3/156 |
| 10,476,369 | B2 | 11/2019 | Chen et al. |
| 2009/0027936 | A1 | 1/2009 | Glueck et al. |
| 2015/0364984 | A1 | 12/2015 | Miyauchi et al. |
| 2019/0238094 | A1 | 8/2019 | Botti et al. |
| 2019/0341847 | A1 | 11/2019 | Yuzurihara et al. |

FOREIGN PATENT DOCUMENTS

| JP | 2006-187138 A | 7/2006 |
| JP | 2008-289275 A | 11/2008 |
| JP | 2010-098829 A | 4/2010 |
| JP | 2016-001960 A | 1/2016 |
| JP | 2018-129891 A | 8/2018 |
| KR | 2011-0064605 A | 6/2011 |

OTHER PUBLICATIONS

Extended Supplementary European Search Report dated Jul. 26, 2024, issued in counterpart Application No. 21781047.2. (14 pages).
Siniscalchi PP et al, A 20 W/Channel Class-D Amplifier With Near-Zero Common-Mode Radiated Emissions, IEEE Journal of Solid-State Circuits, vol. 44, No. 12, p. 3264-3271, 2009, Cited in Extended Supplementary European Search Report dated Jul. 26, 2024. (8 pages).
Office Action dated Aug. 26, 2024, issued in counterpart TW Application No. 110107445 with English translation. (7 pages).
International Search Report dated Jun. 15, 2021, issued in counterpart Application No. PCT/JP2021/010925 (2 pages).
Office Action dated Dec. 10, 2024, issued in counterpart KR Application No. 10-2022-7036153, with English translation. (4 pages).

* cited by examiner

DRIVER DEVICE FOR CLASS-D FULL BRIDGE AMPLIFIER

TECHNICAL FIELD

The present invention relates to a driver device for driving switching elements of a class-D full bridge amplifier.

BACKGROUND ART

A class-D full bridge amplifier consists of a full bridge circuit of semiconductor switching elements, such as MOS-FETs, in which the switching elements are turned on and off to operate the circuit as a chopper circuit, thereby enabling to use as power conversion equipment for converting a DC voltage in a DC power supply into a DC voltage or an AC voltage. There are known power conversion equipment using the class-D full bridge amplifier, such as step-down chopper type DC-DC conversion device, step-up chopper type DC-DC conversion device, and DC-AC inverter. The ON/OFF operation of the switching elements is performed by a driver device. A driver device includes a driver circuit for driving each switching element, and a driver power supply for applying a driver voltage to the driver circuit.

Power conversion equipment using a class-D full bridge amplifier performs a switching operation on each switching element in such a way that driver circuits having different reference voltages are used to drive a switching element on a high-voltage side (high side) and a switching element on a low-voltage side (low side) to thereby convert electric power.

In the high-side switching element on the high-voltage side (high side), the driver circuit on the high side needs to apply a voltage to a gate of the switching element that is higher than a source voltage. In addition to that, it is necessary to avoid an occurrence of a short circuit between the driver circuit on the high side and the driver circuit on the low side respectively having different reference voltages. Due to such electrical needs, an isolated power supply (floating power supply) for electrically isolating the driver circuit on the high side from the driver circuit on the low side is used as a high-side driver power supply for applying a voltage to the driver circuit on the high side. Patent Literature 1 presents a configuration using a power driver transformer as an isolated power supply on the high side.

In order to enhance a response speed of the power conversion equipment, for example, a high-side switching element and a low-side switching element are driven at a high frequency in a MHz range. By increasing the frequency, a high-frequency displacement voltage Vs is generated in the switching element. The high-frequency displacement voltage Vs is applied as a displacement voltage of a source-part voltage to ground in the high-side switching element with respect to an isolating transformer of the high-side driver power supply. To a stray capacitance of the isolating transformer, a differential current associated with the change in the high-frequency displacement voltage Vs flows therein as a leakage current. The leakage current in the stray capacitance of the isolating transformer of the high-side driver power supply causes the high-side switching element on the high side to malfunction. Patent Literature 2 presents a configuration in which a common mode reactor is provided for suppressing a leakage current flowing into a stray capacitance of an isolating transformer of a high-side isolated power supply.

FIG. 17 shows an example of a configuration of power conversion equipment using a class-D full bridge amplifier. A class-D full bridge amplifier 120 consists of a chopper circuit formed by a bridge circuit 121 with a MOSFET and an output transformer 122, by way of example. A high-side driver power supply 112-H of an isolated power supply is connected via an isolating transformer to high-side driver circuits 111-H1 and 111-H2 on a high side, so as to apply a driver voltage to gates of high-side switching elements Q1 and Q2 of the bridge circuit 121 to drive the high-side switching elements Q1 and Q2. A low-side driver power supply 112-L of the isolated power supply is connected via an isolating transformer to low-side driver circuits 111-L3 and 111-L4 on a low side, so as to apply a driver voltage to low-side switching elements Q3 and Q4 of the bridge circuit 121 to drive the low-side switching elements Q3 and Q4. The bridge circuit 121 performs power conversion on a DC voltage in a DC power supply 130 by an ON/OFF operation to output an AC voltage from the output transformer 122.

A high-side driver device 110-H on the high side includes the high-side driver power supply 112-H and the high-side driver circuits 111-H1, 111-H2. The high-side driver circuits 111-H1 and 111-H2 convert a DC voltage of the high-side driver power supply 112-H into a DC voltage isolated from a ground to output gate signals to the gates of the high-side switching elements Q1 and Q2. The high-side driver circuits 111-H1 and 111-H2 have their low voltage parts connected to low voltage parts of the high-side driver power supply 112-H, so as to be isolated from the ground. In the configuration example in FIG. 17, reference potentials of the high-side driver circuits 111-H1, 111-H2 are midpoint voltages $V_N$ of a DC power supply 130.

A low-side driver device 110-L on the low side includes the low-side driver power supply 112-L and the low-side driver circuits 111-L3 and 111-L4. The low-side driver circuits 111-L3 and 111-L4 convert a DC voltage of the low-side driver power supply 112-L into a DC voltage isolated from a ground to output gate signals to the gates of the low-side switching elements Q3 and Q4. The low-side driver circuits 111-L3 and 111-L4 have their low voltage parts connected to a low voltage part of the low-side driver power supply 112-L, so as to be isolated from the ground. In the configuration example in FIG. 17, reference potentials of the low-side driver circuits 111-L3 and 111-L4 on the low side are on a low voltage part of the DC power supply 130.

Between the high-side driver power supply 112-H and the high-side driver circuit 111-H1 and between the high-side driver power supply 112-H and the high-side driver circuit 111-H2, a leakage inductance of a common mode reactor for suppressing a leakage current and capacitances included in the high-side driver power supply 112-H and the high-side driver circuits 111-H1, 111-H2 form a resonance circuit. A resonance phenomenon caused by the resonance circuit leads to a malfunction of the power conversion equipment. In order to attenuate a resonance current by the resonance circuit, the high-side driver circuit 111-H1 and the high-side driver circuit 111-H2 are provided with damping resistances R on their high voltage parts and low voltage parts.

Since a high-frequency displacement voltage is not applied to a low-side isolating transformer on the low side, no leakage current associated with the change in a high-frequency displacement voltage Vs is generated. Thus, it is not necessary to provide the common mode reactor for suppressing the leakage current and the damping resistance R for attenuating the resonance current of the resonance circuit on the low side.

CITATION LIST

Patent Literature

[Patent Literature 1] Japanese Patent Laid-Open Publication No. 2006-187138
[Patent Literature 2] Japanese Patent Laid-Open Publication No. 2018-129891

SUMMARY OF THE INVENTION

Problems to be Solved by the Invention

In the chopper circuit which forms a class-D full bridge amplifier, the switching operations of the high-side switching elements Q1, Q2 on the high side and the low-side switching elements Q3, Q4 on the low side are performed according to predetermined ON time and OFF time in a normal state. However, due to the operating characteristics of the switching elements, a change in an applied voltage or others, timing of turning the switching elements from ON to OFF may be delayed, and any of the switching elements may have longer ON time than that of the other switching elements. This delay operation in the switching element causes the generation of a current that circulates in the class-D full bridge amplifier. In the following, the current circulating in the class-D full bridge amplifier will be expressed as a cross current. The cross current causes unevenness between input/output currents in the full bridge circuit and a driver voltage in each switching element, leading to a malfunction in the class-D full bridge amplifier.

The present invention has a prime task of preventing a malfunction in a class-D full bridge amplifier triggered by a cross current generated in the class-D full bridge amplifier in a power conversion device, and subtasks of making it even between input/output currents in a full bridge circuit which is affected by the cross current and a driver voltage in each switching element.

A first subtask is for making it even a driver voltage of a switching element which becomes uneven in a class-D full bridge amplifier due to a cross current generated between a bridge circuit and a high-side driver circuit by a delay operation of the switching element. When a difference occurs between a current value of a cross current flowing from the bridge circuit to the high-side driver circuit and a current value of a cross current flowing from the high-side driver circuit to the bridge circuit, there occurs unevenness between the driver currents for two high-side switching elements and the driver voltages, and those pose a problem for switching operation.

A second subtask is, in a configuration in which a driver circuit for driving a bridge circuit in each of a plurality of class-D full bridge amplifiers is driven by a common driver power supply, for making it even between input/output currents in a full bridge circuit which are uneven due to a cross current generated by a delay operation in a switching element occurring in the full bridge circuit of any of the class-D full bridge amplifiers and flowing through a closed circuit formed by a DC power supply, a class-D full bridge amplifier and a common driver power supply. When a cross current flows between different class-D full bridge amplifiers, a forward current and a backward current are not even between the DC power supply, which is the main power source, and the class-D full bridge amplifiers, and thereby the plurality of class-D full bridge amplifiers have problems in their amplification operation.

An object of the present invention is to solve the above-mentioned prim task of the existing problem to thereby prevent the occurrence of a malfunction in a class-D full bridge amplifier due to a cross current generated by a delay operation in a switching element.

Another object of the present invention is to solve the first subtask of the existing problem to thereby make even a driver voltage of a switching element which is uneven due to a cross current generated between a bridge circuit and a high-side driver circuit in a class-D full bridge amplifier by a delay operation in a switching element.

Yet another object of the present invention is to solve the second subtask of the existing problem to thereby, in a configuration in which a driver circuit for driving a bridge circuit in each of a plurality of class-D full bridge amplifiers is driven by a driver power supply, make it even between input/output currents in a full bridge circuit which are uneven due to a cross current flowing through a closed circuit formed by a DC power supply, a class-D full bridge amplifier and a common driver power supply when a delay operation in a switching element occurs in the full bridge circuit of any of the class-D full bridge amplifiers.

Means for Solving the Problem

The present invention is a driver device included in a class-D full bridge amplifier for performing power conversion on a DC voltage in a DC power supply, the driver device driving a switching element of a full bridge circuit which consists of four switching elements of two high-side switching elements and two low-side switching elements.

The driver device in the class-D full bridge amplifier of the present invention is configured, with a reference potential of a high-side driver circuit and/or a driver power supply device included in the driver device, to prevent a malfunction in the class-D full bridge amplifier that may be caused by a cross current generated by a delay operation in the switching element, which is the prime task of the invention.

Among four switching elements forming the full bridge circuit of the class-D full bridge amplifier, two high-side driver circuits driving two high-side switching elements have their reference potentials on low voltage parts defined being equipotential in terms of direct current. The configuration with this equipotential in terms of direct current can prevent the generation of a DC component between driver voltages of two high-side switching elements, control the unevenness in the driver voltages due to the cross current flowing through the bridge circuit and the high-side driver circuit, and prevent the occurrence of a malfunction in the class-D full bridge amplifier due to uneven driver voltages.

In addition to that, in a configuration that drives a plurality of class-D full bridge amplifiers by using single DC power supply as a reference power source, each driver circuit for driving each class-D full bridge amplifier is configured to be provided with their own driver power supply instead of sharing the single driver power supply. According to the configuration in which each driver circuit for each of the plurality of class-D full bridge amplifiers has the separate driver power supply, a closed circuit of a path that connects each of the plurality of class-D full bridge amplifiers via the DC power supply and the common driver power supply is not formed. This can control the unevenness in input/output currents in the full bridge circuit due to a cross current flowing through a closed circuit, thereby preventing the occurrence of a malfunction in the class-D full bridge amplifier due to uneven input/output currents.

The driver device of the class-D full bridge amplifier of the invention includes a full bridge circuit consists of four switching elements of two high-side switching elements and two low-side switching elements, and is configured to drive each switching element in the class-D full bridge amplifier for performing power conversion on a DC voltage in a DC power supply. The driver device includes constituent elements described below.

The driver device includes:
(A) a driver circuit for driving each switching element; and
(B) a driver power supply for applying a voltage to the driver circuit.

The driver circuit includes:
(A1) two high-side driver circuit for driving two high-side switching elements; and
(A2) two low-side driver circuit for driving two low-side switching elements.

The driver power supply includes:
(B1) a high-side driver power supply for applying driver voltages to two high-side driver circuits; and
(B2) a low-side driver power supply for applying driver voltages to two low-side driver circuits.

The two high-side driver circuits
(a) have their high voltage parts connected to high voltage parts of the high-side driver power supplies,
(b) have their low voltage parts connected to low voltage parts of the low-side driver power supplies, and
(c) have potentials on the low voltage parts being equipotential in terms of direct current with respect to a reference potential isolated from a ground potential.

In the full bridge circuit,
(d) a midpoint of one series circuit formed of the high-side switching element and the low-side switching element and a midpoint of the other series circuit formed of the other of the high-side switching element and the other of the low-side switching element are equipotential.

The configurations (c) and (d) with reference potentials on the low voltage parts of the two high-side driver circuits being equipotential in terms of direct current prevents the generation of a DC component between the driver voltages in the two high-side switching elements, so as to control unevenness in the driver voltages in the switching elements due to a cross current flowing through the bridge circuit and the high-side driver circuit.

As to the configuration in which the reference potentials on the low voltage parts of the two high-side driver circuits are equipotential in terms of direct current, the reference potentials in terms of direct current can be selected from multiple forms.

First Form:
A first form defines that a reference potential in terms of direct current is a potential at a midpoint of a DC power supply. In the first form, the connection in terms of direct current between the low voltage parts of the two high-side driver circuits and a midpoint is established directly or via an inductance.

Second Form:
A second form defines that a reference potential in terms of direct current is a potential of an output terminal of a class-D full bridge amplifier. In the second form, the connection between the low voltage parts of the two high-side driver circuits and the output terminals of the class-D full bridge amplifiers is established directly or via an inductance.

Third Form:
A third form defines that a reference potential in terms of direct current is a potential of a reference power source isolated from a ground potential. In the second form, the connection between the low voltage parts of the two high-side driver circuits and the reference power source is established directly or via an inductance.

The driver device of the class-D full bridge amplifier of the invention includes the full bridge circuit consists of four switching elements of two high-side switching elements and two low-side switching elements, and is configured to drive each switching element in the class-D full bridge amplifier for performing power conversion on a DC voltage in the DC power supply. The driver device includes constituent elements described below.

The driver device includes:
(A) a driver circuit for driving each switching element; and
(B) a driver power supply for applying a voltage to the driver circuit.

The driver power supply is provided separately with respect to a plurality of class-D full bridge amplifiers connected in parallel to the DC power supply.

In here, the driver power supply needs to be provided to the individual high-side drive circuits, whereas a common driver power supply can be used for the low-side drive circuits.

In a configuration in which the driver power supply is divided and separately provided to each driver circuit of each of the plurality of class-D full bridge amplifiers, a closed circuit of a path for connecting the plurality of class-D full bridge amplifiers via the DC power supply and the common driver power supply is not formed. This enables to control the unevenness in input/output currents in the full bridge circuit due to a cross current flowing through a closed circuit.

By controlling the cross current flowing through the plurality of class-D full bridge amplifiers, between the DC power supply and each class-D full bridge amplifier, no uneven current is generated in a forward current in a forward path from the DC power supply to the class-D full bridge amplifier and in a backward current in a backward path from the class-D full bridge amplifier to the DC power supply. It prevents the occurrence of the malfunction in the amplification operation in the class-D full bridge amplifiers caused by the cross current. In addition to that, the currents flowing into and flowing out from each class-D full bridge amplifier are even to each other, so that input-output measurement can be performed on each class-D full bridge amplifier.

The driver device of the class-D full bridge amplifier of the invention consists of four switching elements of two high-side switching elements and two low-side switching elements, and is configured to drive each switching element in the class-D full bridge amplifier for performing power conversion on a DC voltage in the DC power supply. The driver device has a configuration for solving the first subtask and a configuration for solving the second subtask to thereby prevent the occurrence of the malfunction in the amplifier of the class-D full bridge circuit due to two kinds of cross currents respectively flowing inside each class-D full bridge amplifier as a unit and between the plurality of class-D full bridge amplifiers.

The configuration for solving the first subtask prevents the generation of a DC component between the driver voltages in two high-side switching elements, thereby preventing the driver voltages in the switching elements from being uneven to each other due to the cross current flowing through the bridge circuit and the high-side driver circuit. The configuration for solving the second subtask prevents the formation of a closed circuit of a path connecting the plurality of class-D full bridge amplifiers to thereby suppress the generation of the cross current flowing between the plurality of class-D full bridge amplifiers.

Effect of the Invention

As described above, the present invention prevents the occurrence of the malfunction in the amplifier of the class-D full bridge circuit caused by the cross current.

In regard to the first subtask, the invention can prevent, in the class-D full bridge amplifiers, the occurrence of the unevenness in the driver voltages in the switching elements due to the cross current generated between the bridge circuit and the high-side driver circuit by the delay operation in the switching element.

In regard to the second subtask, when a delay operation in a switching element occurs in a full bridge circuit of any of the class-D full bridge amplifiers in the configuration for driving the bridge circuits of the plurality of class-D full bridge amplifiers with the driver power supply, the invention prevents the formation of a closed circuit between the DC power supply, the class-D full bridge amplifier and the common driver power supply, thereby suppressing the cross current flowing between the plurality of class-D full bridge amplifiers and controlling the unevenness in the input/output currents in the full bridge circuit due to the cross current.

BEST MODE FOR CARRYING OUT THE INVENTION

Now, a first configuration of the invention will be described by using FIGS. 1 to 7, a second configuration of the invention will be described by using FIGS. 8 to 12, and a circuit example and a comparative circuit of the invention will be described by using FIGS. 13 to 16.

<First Configuration>

In regard to the first configuration, an example of the first configuration of the invention will be described by using FIGS. 1 to 4, and a comparative configuration example of the first configuration will be described by using FIGS. 5 to 7.

The first configuration of a driver device of a class-D full bridge amplifier according to the present invention has reference potentials on low voltage parts of two high-side driver circuits defined to be equipotential in terms of direct current, so as to prevent the generation of a DC component between driver voltages of the two high-side switching elements and thus prevent an occurrence of unevenness in the driver voltages of the switching elements due to a cross current flowing between a bridge circuit and the high-side driver circuit.

Figure 1:
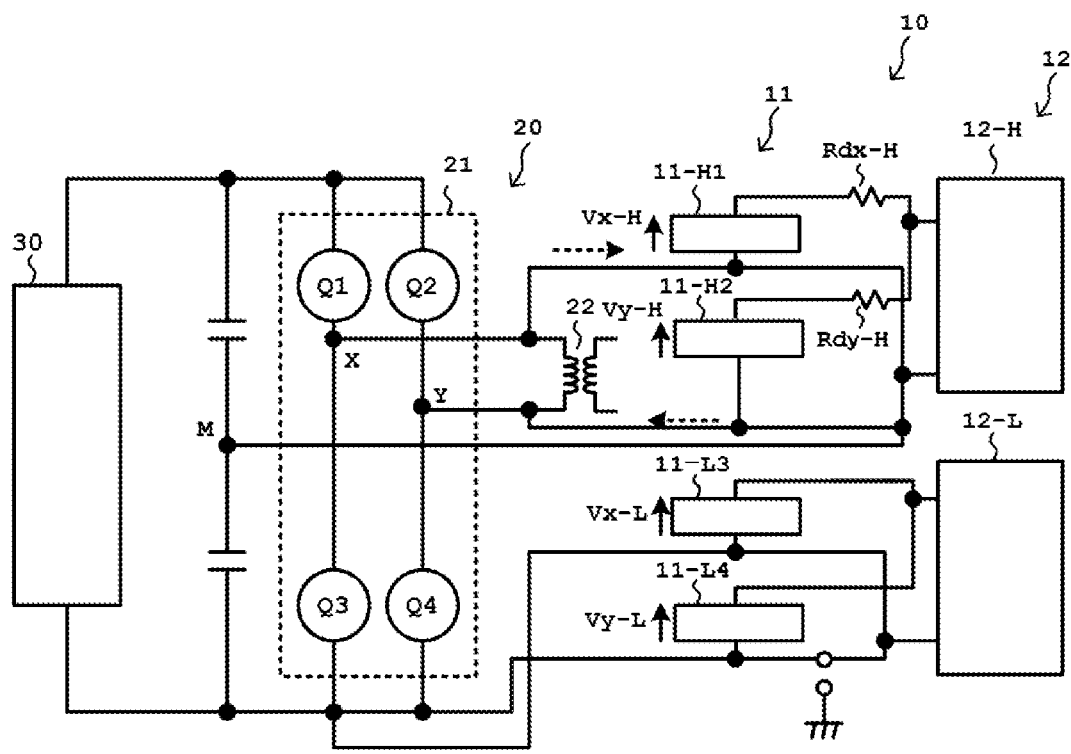
FIG. 1 is a schematic block diagram illustrating a first configuration of a driver device in a class-D full bridge amplifier according to the invention.
Figure 2:
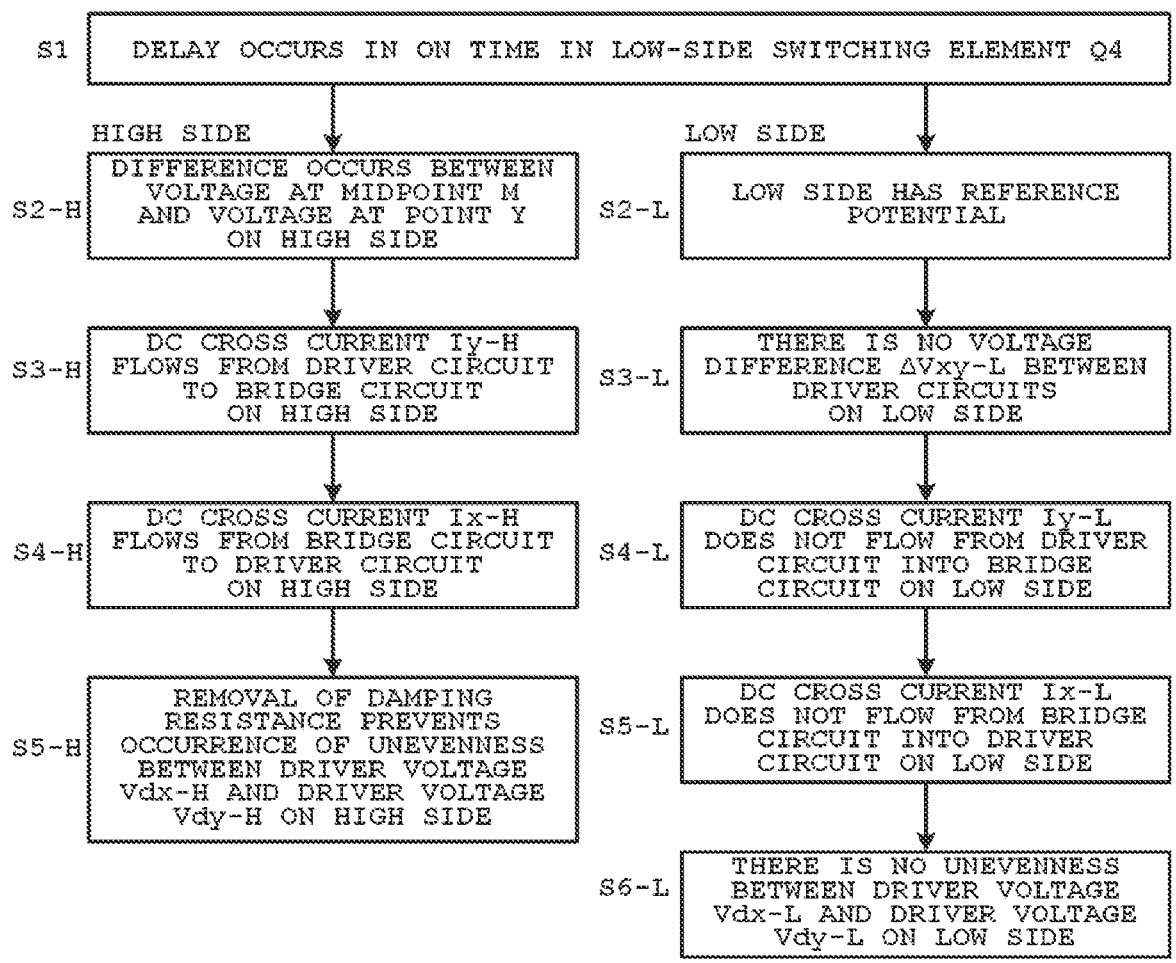
FIG. 2 is a flowchart illustrating an operation example of the first configuration of the driver device in the class-D full bridge amplifier according to the invention.
Figure 3:
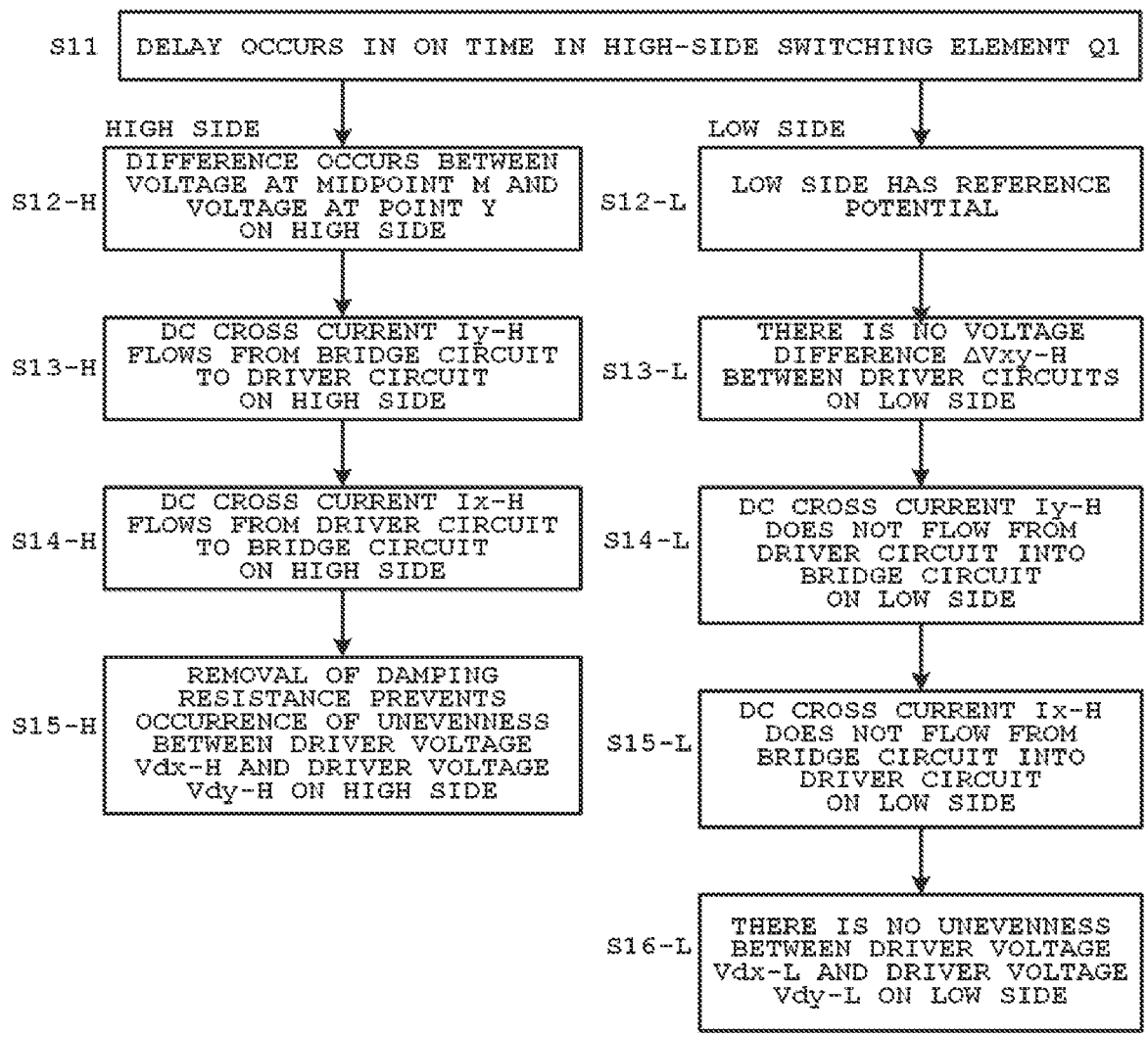
FIG. 3 is a flowchart illustrating another operation example of the first configuration of the driver device in the class-D full bridge amplifier according to the invention.
Figure 4:
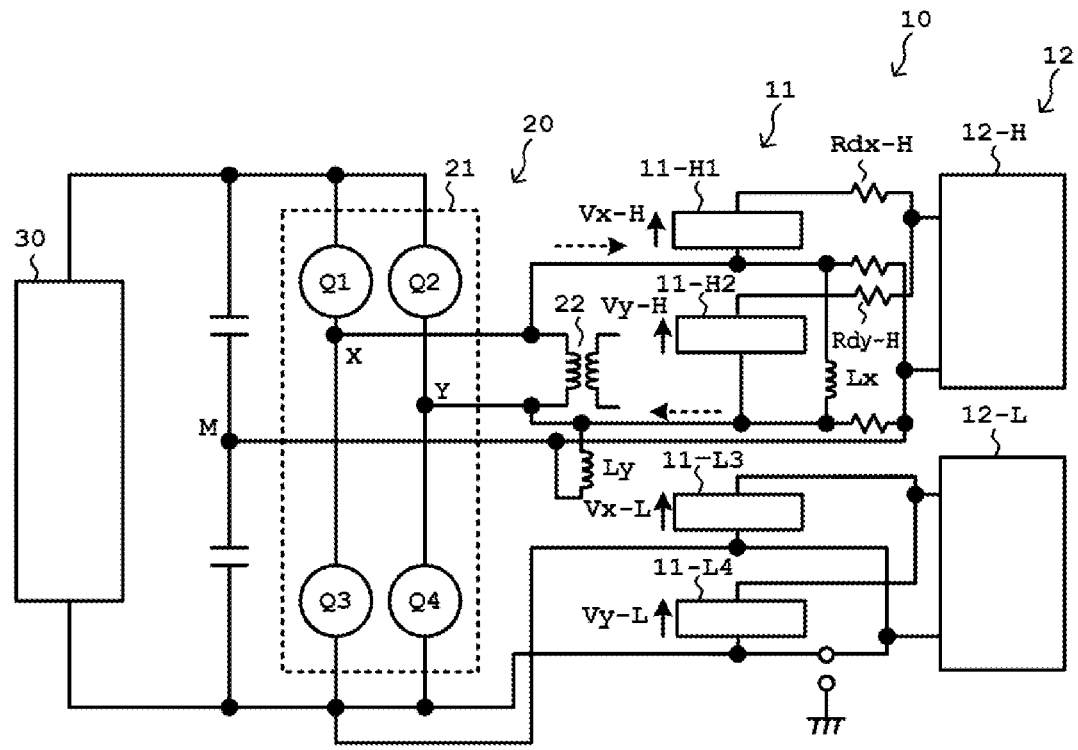
FIG. 4 is a schematic block diagram illustrating a variation of the first configuration of the driver device in the class-D full bridge amplifier according to the invention.

An example of the first configuration of the invention will be described by using FIGS. 1 to 4. FIG. 1 is a schematic block diagram illustrating the first configuration of the driver device of the class-D full bridge amplifier of the invention, and FIGS. 2 and 3 are flowcharts illustrating operation examples of the first configuration. FIG. 4 is a schematic block diagram illustrating a variation of the first configuration.

(1) Example of Configuration

In FIG. 1, a class-D full bridge amplifier 20 includes a full bridge circuit 21 and an output transformer 22, so as to perform power conversion on a DC voltage in a DC power supply 30 by a switching operation of the full bridge circuit 21 and output the converted voltage from the output transformer 22. The full bridge circuit 21 includes four switching elements of high-side switching elements Q1, Q2 and low-side switching elements Q3, Q4, in which a series circuit consisting of the high-side switching element Q1 and the low-side switching element Q3 is used as one of legs and a series circuit consisting of the high-side switching element Q2 and the low-side switching element Q4 is used as the other leg to form a bridge circuit. The high-side switching elements Q1 and Q2 have their high voltage parts connected with a high voltage part of the DC power supply 30, and the low-side switching elements Q3 and Q4 have their low voltage parts connected with a low voltage part of the DC power supply 30. A point X in one of the legs and a point Y in the other leg are connected to input parts of the output transformer 22.

The driver device 10 includes a driver circuit 11 that applies a driver voltage to gates of a switching elements in the full bridge circuit 21 to drive the switching elements, and a driver power supply 12 that applies the driver voltage to the driver circuit 11.

The driver circuit 11 includes a high-side driver circuit 11-H1 that drives the high-side switching element Q1, a high-side driver circuit 11-H2 that drives the high-side switching element Q2, a low-side driver circuit 11-L3 that drives the low-side switching element Q3, and a low-side driver circuit 11-L4 that drives the low-side switching element Q4.

The driver power supply 12 includes a high-side driver power supply 12-H and a low-side driver power supply 12-L. The high-side driver power supply 12-H applies a driver voltage to the high-side driver circuit 11-H1 and the high-side driver circuit 11-H2, and the low-side driver power supply 12-L applies a driver voltage to the low-side driver circuit 11-L3 and the low-side driver circuit 11-L4.

The high-side driver circuit 11-H1 and the high-side driver circuit 11-H2 have their high voltage parts connected to a high voltage part of the high-side driver power supply 12-H via a damping resistance Rd-H1. The damping resistance Rd-H1 attenuates a resonance current flowing through a resonance circuit on a high side due to a leakage inductance and a stray capacitance. The damping resistance Rd-H1 needs not necessarily be provided.

The high-side driver circuit 11-H1 has its low voltage part connected to a point X between the high-side switching element Q1 and the low-side switching element Q3, and the high-side driver circuit 11-H2 has its low voltage part connected to a point Y between the high-side switching element Q2 and the low-side switching element Q4. In addition to that, both of the low voltage parts are connected to a midpoint M between a high voltage part and a low voltage part of the DC power supply 30.

In a case where no delay operation occurs in a switching element, the low voltage parts of the high-side driver circuit 11-H1 and the high-side driver circuit 11-H2 are directly connected without the damping resistance, so that these circuits are equipotential. Then, the low voltage parts are connected to the midpoint M of the DC power supply 30, their potentials are kept to a reference potential of a midpoint voltage VDD/2. In here, VDD is a voltage in the DC power supply 30. Consequently, no cross current flows between the full bridge circuit 21 and the high-side driver circuit 11-H1 and between the full bridge circuit 21 and the high-side driver circuit 11-H2.

The low-side driver circuit 11-L3 and the low-side driver circuit 11-L4 have their high voltage parts directly connected to the high voltage part of the low-side driver power supply 12-L without the damping resistance. The low side may be connected via the damping resistances, as with those of the high-side driver circuits.

The low voltage parts of the low-side driver circuit 11-L3 and the low-side driver circuit 11-L4 become equipotential by the direct connection without the damping resistances, and their potentials are kept to a predetermined reference potential by the connection to the low voltage part of the DC power supply 30.

Since no current leakage due to a high-frequency displacement voltage occurs on the low side, it is not necessary to provide a damping resistance for attenuating the resonance current in the resonance circuit formed by a common mode reactor and a stray capacitance. Accordingly, the low voltage parts of the low-side driver circuit 11-L3 and the low-side driver circuit 11-L4 are directly connected, so that their potentials are equipotent and kept to the reference potential. In this way, when there is no delay operation in the switching element, no cross current flows between the full bridge circuit 21 and the low-side driver circuit 11-L3 and between the full bridge circuit 21 and the low-side driver circuit 11-L3.

Next, a description will be made about an operation example for a case where a delay operation occurs in a switching element. In the following description, FIG. 2 is referred to illustrate an operation example for a case where a delay operation occurs in a low-side switching element, and FIG. 3 is referred to illustrate an operation example for a case where a delay operation occurs in a high-side switching element.

(2) Operation Example 1:

In FIG. 2, Operation Example 1 is for a case where a delay operation occurs in the low-side switching element Q4. The delay operation in the low-side switching element Q4 causes an ON time in the low-side switching element Q4 to fall behind a predetermined time (S1).

(2-1) Operation on the High Side

In an operation state where the delay operation has occurred in the low-side switching element Q4, a midpoint potential M is not VDD/2, and thus it can be considered that a DC voltage component has been generated at the point Y seen from the midpoint potential M (S2-H). This DC voltage component causes the flow of direct current electricity Iy-H from the driver circuit 11-H2 into the bridge circuit 21 (S3-H) while causing the flow of direct current electricity Ix-H in the bridge circuit 21 out to the driver circuit 11-H1 (S4-H), and thereby a cross current flows between these circuits. The cross current causes the generation of a voltage in a case where a resistance exists on a return side of the driver circuit 11-1H2, resulting in unevenness in driver voltages.

The present invention has a configuration in which a damping resistance is omitted and a direct connection is established on the return side from the driver circuit 11-H2 to the bridge circuit 21. In this configuration, even though the cross current flows between these circuits, the cross current does not affect the voltage in the driver circuit. Consequently, there is no unevenness between a driver voltage Vdx-H applied to the switching element Q1 by the high-side driver circuit 11-H1 and a driver voltage Vdy-H applied to the switching element Q2 by the high-side driver circuit 11-H2 (S5-H).

(2-2) Operation on the Low Side

On the low side, since the low voltage part of the driver circuit is connected to the low voltage parts of the elements Q3 and Q4 (the low voltage part of the DC power supply), their potentials are kept to the reference potential (S2-L). Thus, there is no voltage difference ΔVxy-L between the low-side driver circuit 11-L3 and the low-side driver circuit 11-L4 (S3-L). Since there is no voltage difference ΔVxy-L, a DC cross current Iy-L flowing from the low-side driver circuit 11-L3 to the full bridge circuit 21 is not generated (S4-L). Correspondingly, a DC cross current Ix-L flowing from the full bridge circuit 21 to the low-side driver circuit 11-L4 is not generated (S5-L). Since the cross current Ix-L and the cross current Iy-L are not generated, there is no unevenness between a driver voltage Vdx-L applied to the switching element Q3 by the low-side driver circuit 11-L3 and a driver voltage Vdy-L applied to the switching element Q4 by the low-side driver circuit 11-L4 (S6-L).

(3) Operation Example 2:

In FIG. 3, Operation Example 2 is for a case where a delay operation occurs in a high-side switching element Q1. The delay operation in the high-side switching element Q1 causes an ON time in the high-side switching element Q1 to fall behind a predetermined time (S11).

(3-1) Operation on the High Side:

In an operation state where the delay operation has occurred in the high-side switching element Q1, a midpoint potential M is not VDD/2, and thus it can be considered that a DC voltage component has been generated at the point X seen from the midpoint potential M (S12-H). This DC voltage component causes the flow of direct current electricity Iy-H from a bridge circuit 21 into a driver circuit 11-H2 (S13-H) while causing the flow of direct current electricity Ix-H in a driver circuit 11-H1 out to the bridge circuit 21 (S14-H), and thereby a cross current flows between these circuits. The cross current causes the generation of a voltage in a case where a resistance exists on the return side of the driver circuit 11-1H2, resulting in unevenness in driver voltages.

The driver device of the present invention has a configuration in which a damping resistance is omitted and a direct connection is established on the return side from the driver circuit 11-H2 to the bridge circuit 21. In this configuration, even though the cross current flows between these circuits, the cross current does not affect the voltage in the driver circuit. Consequently, there is no unevenness between a driver voltage Vdx-H applied to the switching element Q1 by the high-side driver circuit 11-H1 and a driver voltage Vdy-H applied to the switching element Q2 by the high-side driver circuit 11-H2 (S15-H).

(3-2) Operation on the Low Side

On the low side, the low voltage part of the driver circuit is connected to the low voltage parts of the elements Q3 and Q4, and their potentials are kept (S12-L). Thus, there is no voltage difference between the low-side driver circuit 11-L3 and the low-side driver circuit 11-L4 (S13-L). Since there is no voltage difference, the DC cross current flowing from the low-side driver circuits 11-L3 and 11-L4 to the full bridge circuit 21 is not generated (S14-L). Correspondingly, the DC cross current flowing from the full bridge circuit 21 to the low-side driver circuits 11-L3 and 11-L4 is not generated (S15-L).

Since the cross current Ix-L and the cross current Iy-L are not generated, there is no unevenness between the driver voltage Vdx-L applied to the switching element Q3 by the low-side driver circuit 11-L3 and the driver voltage Vdy-L applied to the switching element Q4 by the low-side driver circuit 11-L4 (S16-L).

(4) Variation of First Configuration:

FIG. 4 is a schematic block diagram illustrating a variation of the first configuration. The variation of the first configuration has a connection configuration for connecting in terms of direct current low voltage parts of the high-side driver circuit 11-H1 and the high-side driver circuit 11-H2, in which the driver circuits are connected via an inductance with respect to a reference potential instead of connecting directly with respect to the reference potential.

The configuration shown in FIG. 4 connects the low voltage part of the high-side driver circuit 11-H1 with the low voltage part of the high-side driver circuit 11-H2 via an inductance Lx, and also connects the low voltage part of the high-side driver circuit 11-H2 with a midpoint M via an inductance Ly. According to the variation of the first configuration, impedance components with respect to direct current electricity of inductances Lx and Ly are negligible, and thus the connection is equivalent to the direct current connection.

In the following description, as a comparative configuration example of the first configuration, a configuration having a damping resistance connected between the low voltage part of the high-side driver circuit and the reference potential will be described.

(1) Comparative Configuration Example

Figure 5:
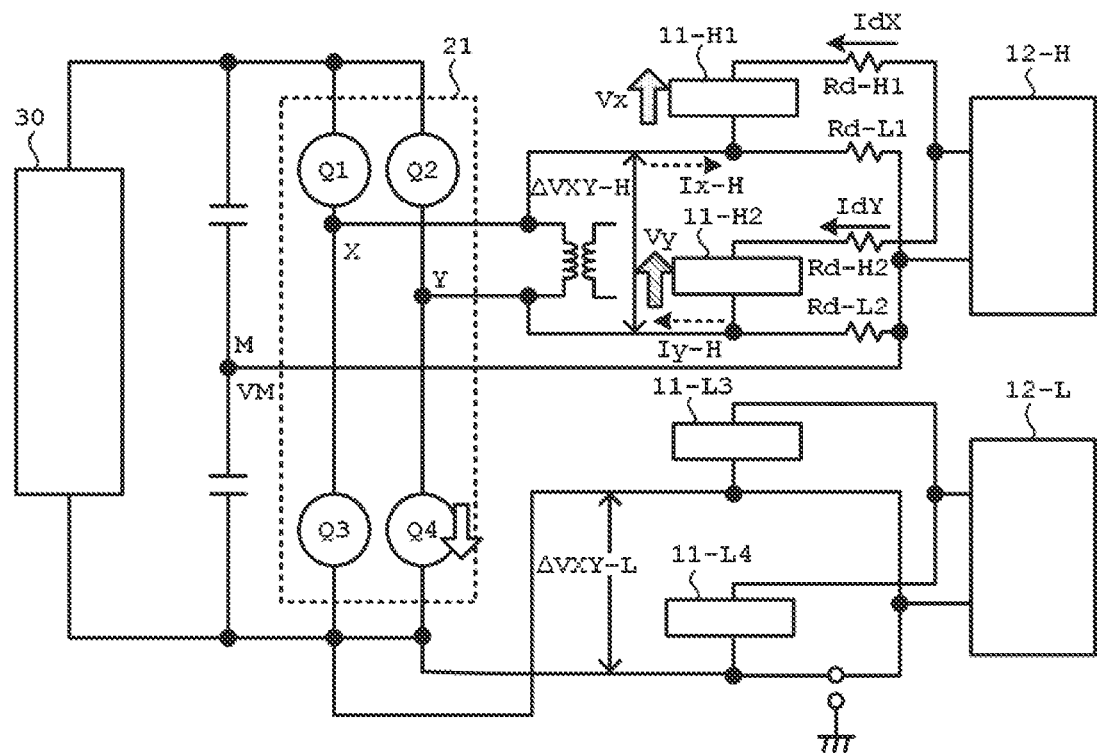
FIG. 5 is a schematic block diagram illustrating a comparative configuration example of the first configuration of the driver device in the class-D full bridge amplifier according to the invention.
Figure 6:
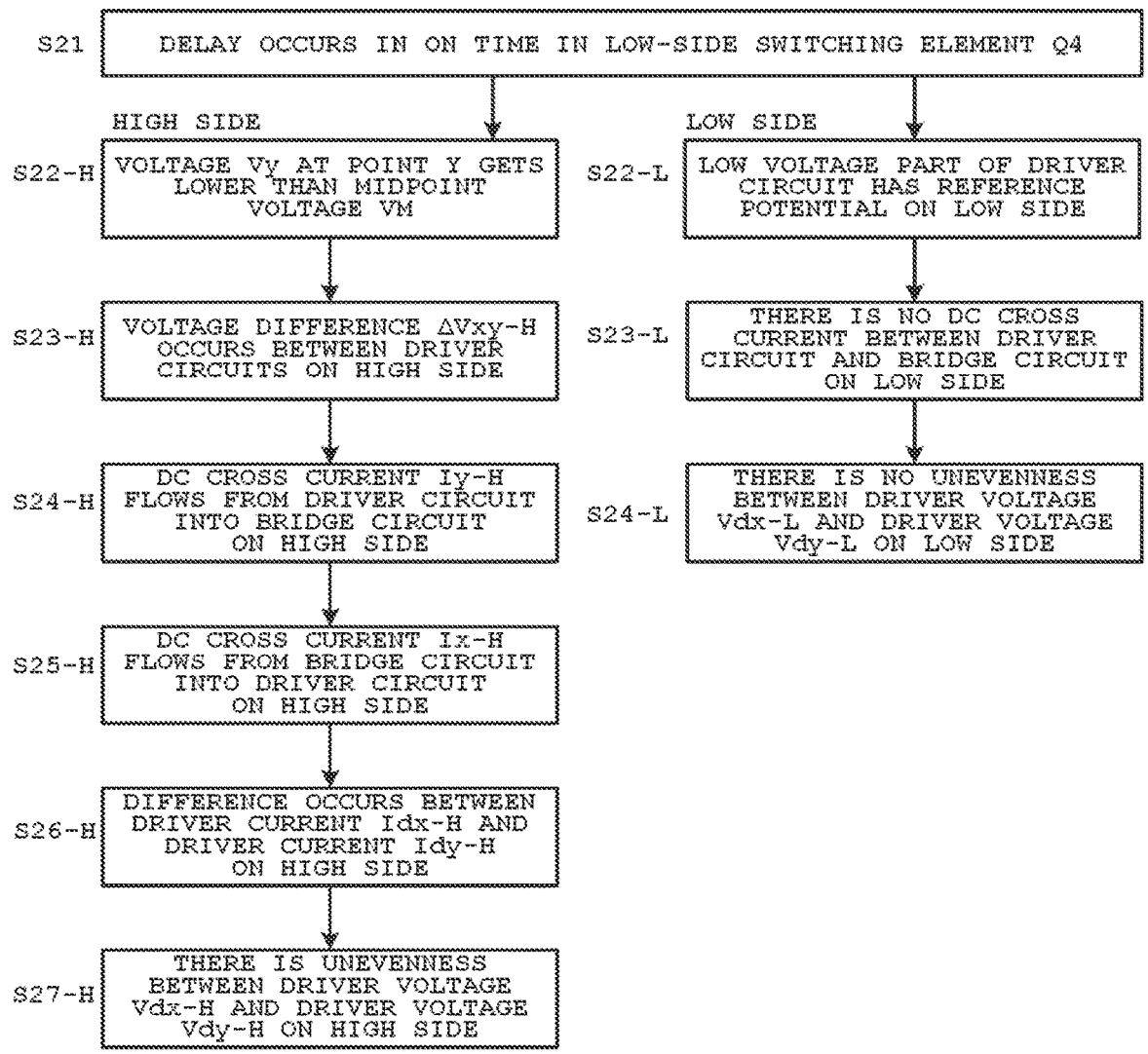
FIG. 6 is a flowchart illustrating an operation example of the comparative configuration example in the first configuration of the driver device in the class-D full bridge amplifier according to the invention.
Figure 7:
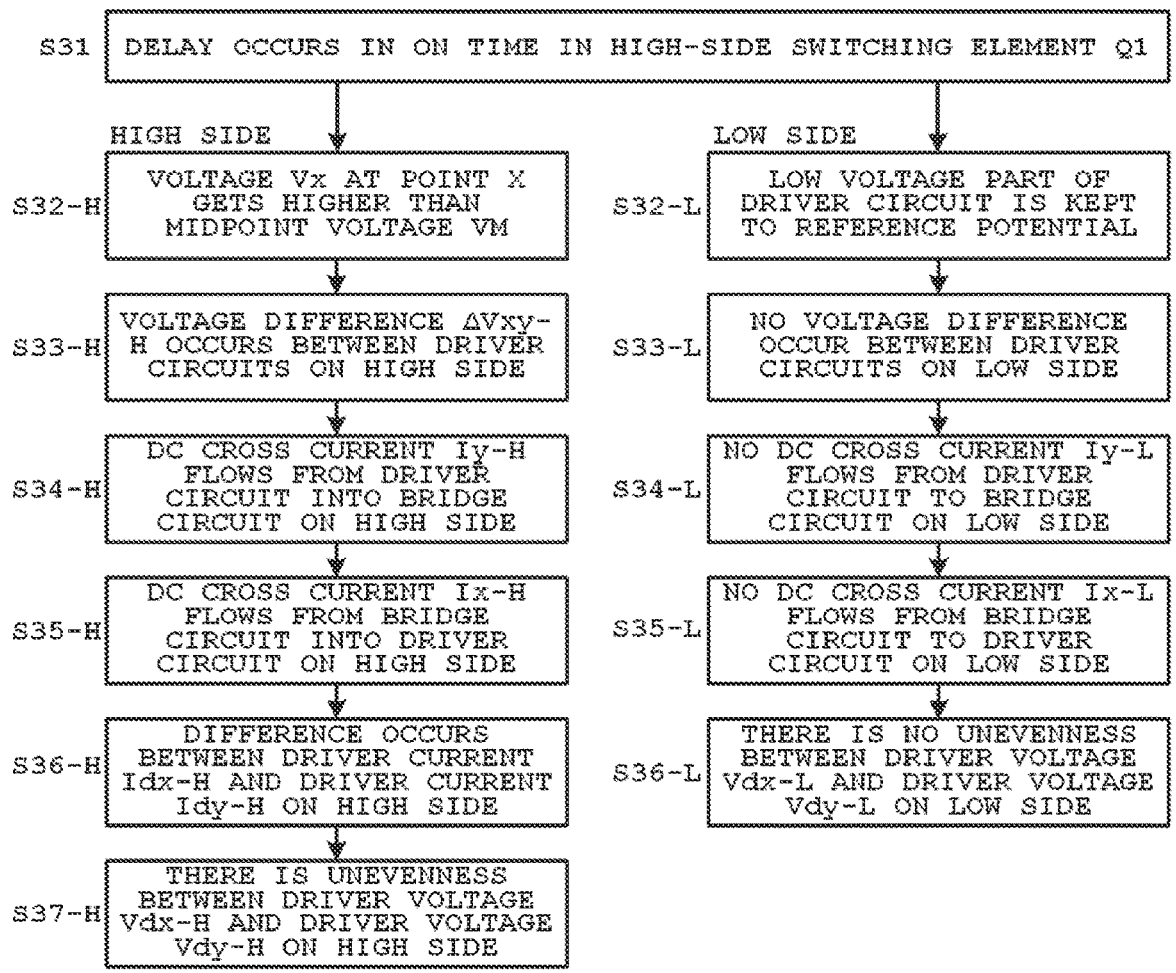
FIG. 7 is a flowchart illustrating an operation example of the comparative configuration example in the first configuration of the driver device in the class-D full bridge amplifier according to the invention.

FIG. 5 is a schematic block diagram illustrating the comparative configuration example of the first configuration, and FIGS. 6 and 7 are flowcharts illustrating operation examples of the comparative configuration example in the first configuration.

In FIG. 5, the comparative configuration example in the first configuration shows that, in addition to a damping resistance Rd-H1 provided between a high voltage part of a high-side driver circuit 11-H1 and a high voltage part of a high-side driver power supply 12-H in the first configuration of the invention, a damping resistance Rd-L1 is provided between a low voltage part of the high-side driver circuit 11-H1 and a low voltage part of a high-side driver power supply 12-H, and in addition to a damping resistance Rd-H2 provided between the high voltage part of the high-side driver circuit 11-H2 and the high voltage part of the high-side driver power supply 12-H, a damping resistance Rd-L2 is provided between the low voltage part of the high-side driver circuit 11-H2 and the low voltage part of the high-side driver power supply 12-H.

Next, a description will be made about a comparative operation example when a delay operation occurs in a switching element. In the following description, FIG. 6 is referred to illustrate a comparative operation example for a case where a delay operation occurs in a low-side switching element, and FIG. 7 is referred to illustrate a comparative operation example for a case where a delay operation occurs in a high-side switching element.

(2) Comparative Operation Example 1:

In FIG. 6, Comparative Operation Example 1 is for a case where a delay operation occurs in a low-side switching element Q4. The delay operation in the low-side switching element Q4 causes an ON time in the low-side switching element Q4 to fall behind a predetermined time (S21).

(2-1) Comparative Operation on the High Side:

FIG. 6 shows on its left section an operation state on the high side. On the high side, a point Y between a high-side switching element Q2 and the low-side switching element Q4 has lower voltage than a voltage VM at a midpoint M (S22-H). Since the voltage at the point Y is lower than the voltage VM at the midpoint M, a voltage difference ΔVxy-H occurs between a high-side driver circuit 11-H1 and a high-side driver circuit 11-H2 (S23-H).

A DC cross current Iy-H flows from the high-side driver circuit 11-H2 toward the point Y in a full bridge circuit 21 (S24-H), and a DC cross current Ix-H flows from a point X in the full bridge circuit 21 toward the high-side driver circuit 11-H1 (S25-H). The generation of the cross current Ix-H and the cross current Iy-H causes a difference between a driver current Idx-H flowing through the high-side driver circuit 11-H1 and a driver current Idy-H flowing through the high-side driver circuit 11-H2 on the high side (S26-H).

The difference between the driver current Idx-H and the driver current Idy-H causes the unevenness between the driver voltage Vdx-H applied to a high-side switching element Q1 by the high-side driver circuit 11-H1 and the driver voltage Vdy-H applied to a high-side switching element Q2 by the high-side driver circuit 11-H2 (S27-H).

Since damping resistances (Rd-L1, Rd-L2) are provided on the low voltage parts of the high-side driver circuit 11-H1 and the high-side driver circuit 11-H2 in the comparative configuration example, a DC voltage component is generated between the point X and the point Y, and thus a voltage difference ΔVxy-H occurs between a voltage Vx at the point X and a voltage Vy at the point Y, and the voltages differ from the voltage VM at the midpoint M. Consequently, the direct-current electricity Iy-H flows from the high-side driver circuit 11-H2 toward the point Y in the full bridge circuit 21 and the direct-current electricity Ix-H flows from the point X in the bridge circuit of the full bridge circuit 21 toward the high-side driver circuit 11-H1.

In the configuration in which the damping resistances are provided on the low voltage parts of the high-side driver circuit 11-H1 and the high-side driver circuit 11-H2, when the ON state of a gate signal is prolonged by ΔT due to the delay operation in the switching element Q4, the voltage VM at the point M becomes lower than the midpoint voltage VDD/2.

In here, a time width of the ΔT is about 1 ns, for instance.

The decrease in the voltage VM at the point M can be regarded as the generation of the DC voltage component at the point Y seen from the midpoint M, in which case the voltage Vy at the point Y is lower than the voltage VM at the midpoint M, and thus the direct-current electricity Iy-H flows from the high-side driver circuit 11-H2 toward the point Y in the full bridge circuit 21. The voltage Vx at the point X at which a signal delay due to the delay operation does not occur is higher than the voltage Vy at the point Y, and thereby the direct-current electricity Ix-H flows from the point X in the full bridge circuit 21 to the high-side driver circuit 11-H1.

As a consequence, the driver voltage Vdx-H applied to the high-side switching element Q1 by the high-side driver circuit 11-H1 differs from the driver voltage Vdy-H applied to the high-side switching element Q2 by the high-side driver circuit 11-H2.

(2-2) Comparative Operation on the Low Side:

FIG. 6 shows on its right section an operation state on the low side. On the low side, the low voltage part of the driver circuit is connected to the low voltage parts of the elements Q3 and Q4, so that its potential is kept to a reference potential of a ground potential (S22-L). Since there is no difference in the voltages, a DC cross current is not generated between low-side driver circuits 11-L3, 11-L4 and the full bridge circuit 21 (S23-L). Consequently, there is no unevenness between a driver voltage Vdx-L applied to the switching element Q3 by the low-side driver circuit 11-L3 and a driver voltage Vdy-L applied to the switching element Q4 by the low-side driver circuit 11-L4 (S24-L).

(3) Comparative Operation Example 2:

In FIG. 7, Operation Example 2 is for a case where a delay operation occurs in a high-side switching element Q1. The delay operation in the high-side switching element Q1 causes an ON time in the high-side switching element Q1 to fall behind a predetermined time (S31).

(3-1) Comparative Operation on the High Side:

FIG. 7 shows on its left section an operation state on the high side. On the high side, a point X between the high-side switching element Q1 and a low-side switching element Q3 has higher voltage than a voltage VM at a midpoint M (S32-H). Since the voltage at the point X is higher than the voltage VM at the midpoint M, a voltage difference ΔVxy-H occurs between a high-side driver circuit 11-H1 and a high-side driver circuit 11-H2 (S33-H).

A DC cross current Iy-H flows from the high-side driver circuit 11-H2 toward the point X in a full bridge circuit 21 (S34-H), and a DC cross current Ix-H flows from the point X in the full bridge circuit 21 toward the high-side driver circuit 11-H1 (S35-H).

The generation of the cross current Ix-H and a cross current Iy-H causes a difference between a driver current Idx-H flowing through the high-side driver circuit 11-H1 and a driver current Idy-H flowing through the high-side driver circuit 11-H2 on the high side (S36-H).

The difference between the driver current Idx-H and the driver current Idy-H causes the unevenness between a driver voltage Vdx-H applied to the high-side switching element Q1 by the high-side driver circuit 11-H1 and a driver voltage Vdy-H applied to a high-side switching element Q2 by the high-side driver circuit 11-H2 (S37-H).

(3-2) Comparative Operation on the Low Side:

FIG. 7 shows on its right section an operation state on the low side. On the low side, the low voltage part of the driver circuit is connected to the low voltage parts of the elements Q3 and Q4, so that its potential is kept to a reference potential of a ground potential (S32-L). Since the potentials are even to each other, there is no difference in the voltages between a low-side driver circuit 11-L3 and a low-side driver circuit 11-L4 (S33-L). Since there is no difference in the voltages, a DC cross current Iy-L flowing from the low-side driver circuit 11-L3 toward the full bridge circuit 21 is not generated (S34-L). Correspondingly, the DC cross current Ix-L flowing from the full bridge circuit 21 toward the low-side driver circuit 11-L4 is not generated (S35-L). Since the cross current Ix-L and the cross current Iy-L are not generated, there is no unevenness between a driver voltage Vdx-L applied to the switching element Q3 by the low-side driver circuit 11-L3 and a driver voltage Vdy-L applied to the switching element Q4 by the low-side driver circuit 11-L4 (S36-L).

<Second Configuration>

Figure 9:
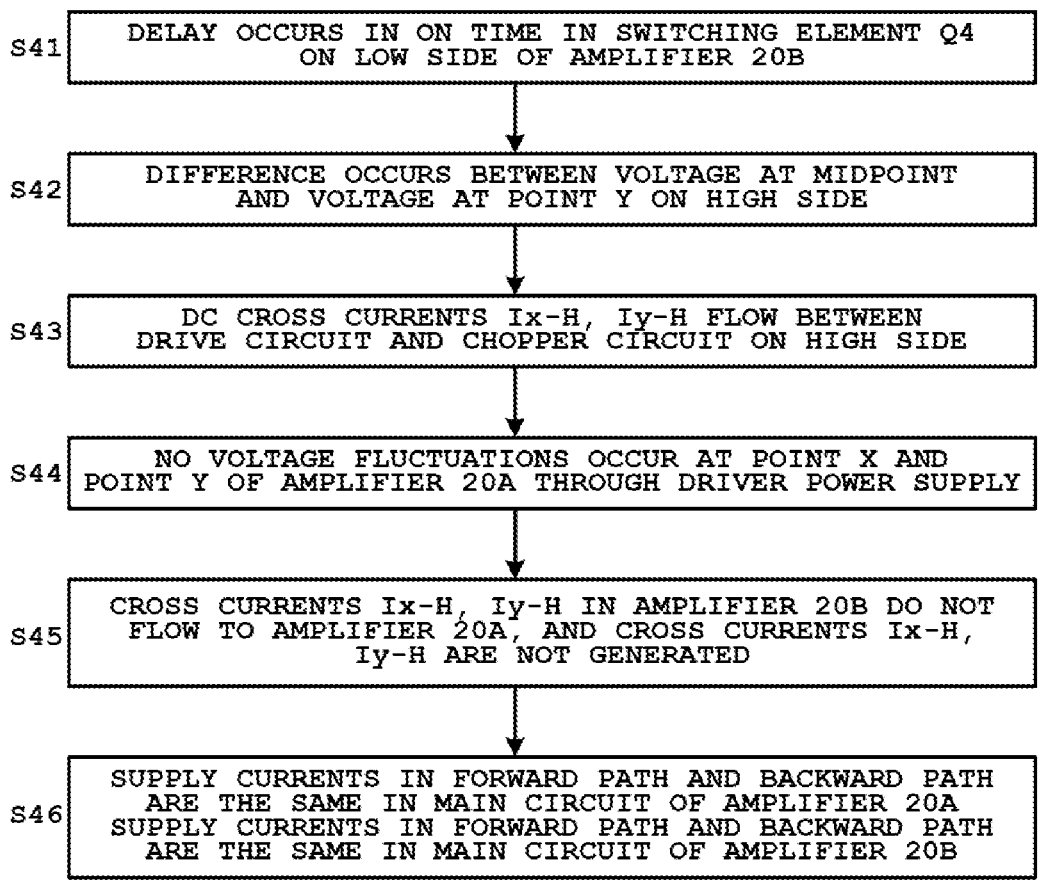
FIG. 9 is a flowchart illustrating an operation example of the second configuration of the driver device in the class-D full bridge amplifier according to the invention.
Figure 10:
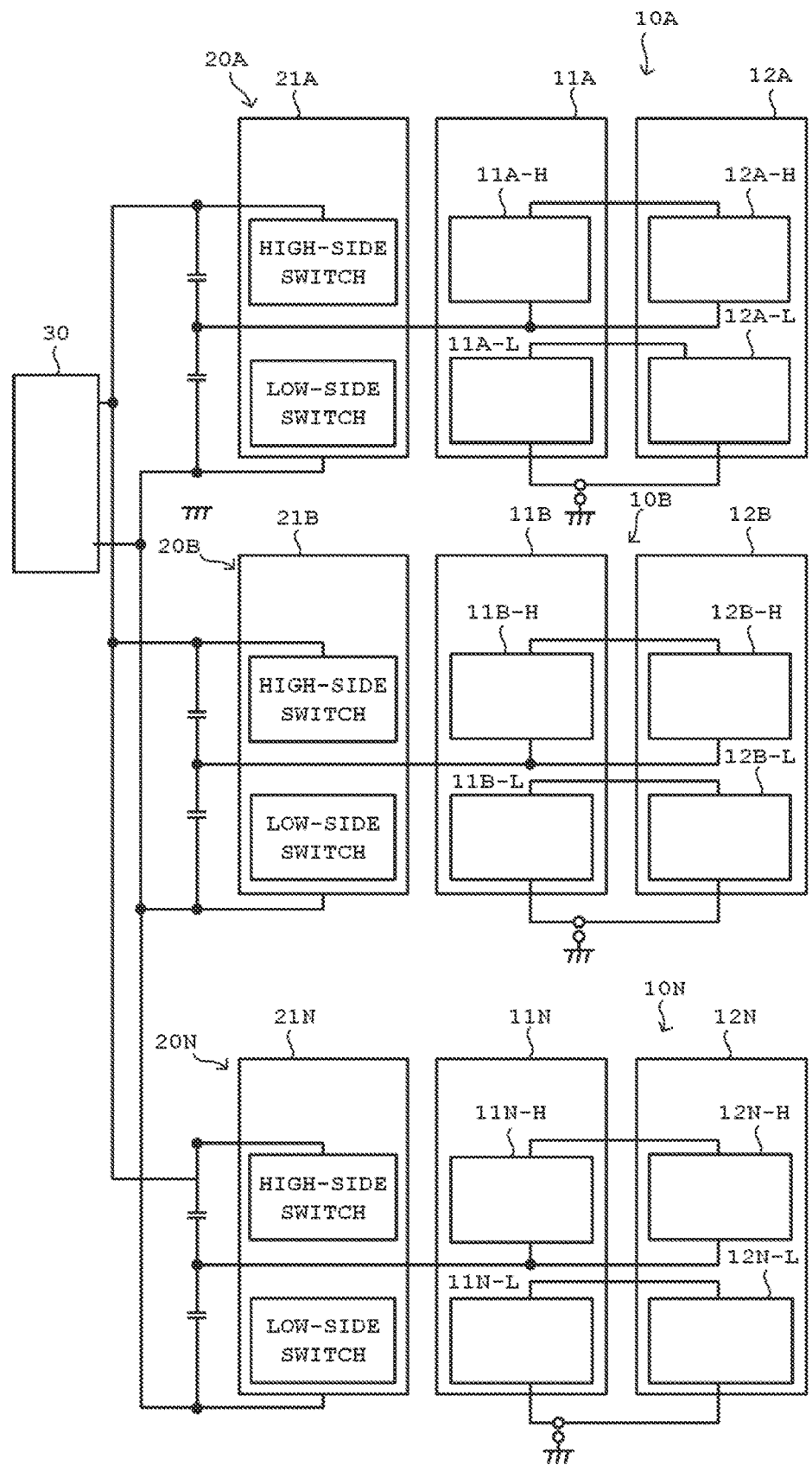
FIG. 10 is a schematic block diagram showing a case of N-number of class-D full bridge amplifiers of the driver device in the class-D full bridge amplifier according to the invention.
Figure 11:
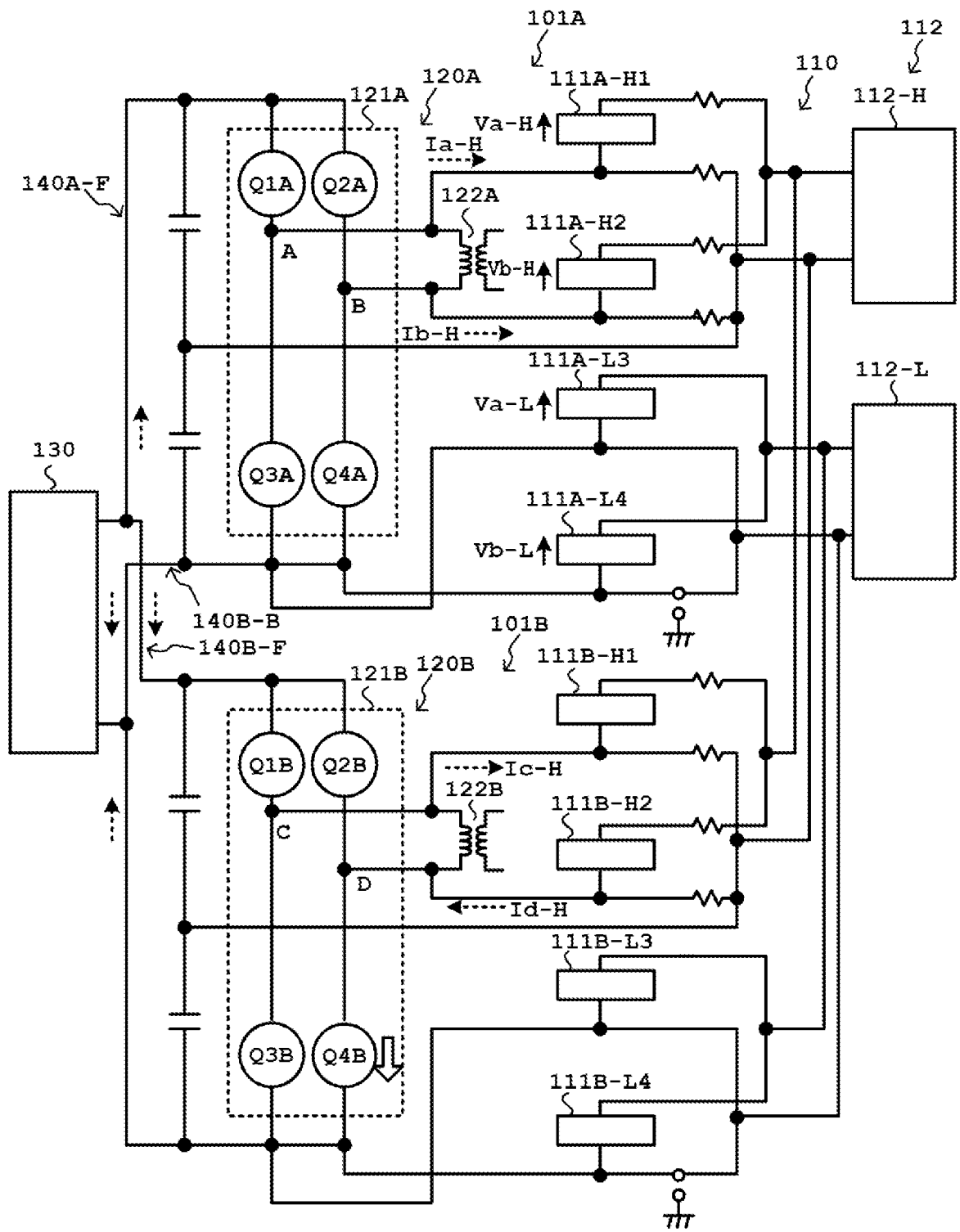
FIG. 11 is a schematic block diagram illustrating a comparative configuration example of the second configuration of the driver device in the class-D full bridge amplifier according to the invention.

In regard to the second configuration, examples of the second configuration of the invention will now be described by using FIGS. 8 to 10, and comparative configuration examples of the second configuration will be described by using FIGS. 11 and 12.

The second configuration of the driver device of the class-D full bridge amplifier according to the invention provides driver power supplies to individual driver circuits for bridge circuits of a plurality of class-D full bridge amplifiers, instead of driving the driver circuits by one common driver power supply. This configuration can prevent the formation of a closed circuit configured by a DC power supply, a class-D full bridge amplifier and a driver power supply even when a delay operation occurs in a switching element in a bridge circuit of any of the class-D full bridge amplifiers, thereby preventing a cross current generated by the delay operation from flowing into the other class-D full bridge amplifiers.

A description will be made about two examples of the second configurations of the invention by referring to FIGS. 8 to 10. FIG. 8 is a schematic block diagram illustrating the second configuration of the driver device of the class-D full bridge amplifier of the invention, and FIG. 9 is a flowchart illustrating an operation example of the second configuration. FIG. 10 is a schematic block diagram showing a case of applying the second configuration to N-number of class-D full bridge amplifiers.

(1) Configuration Example

Figure 8:
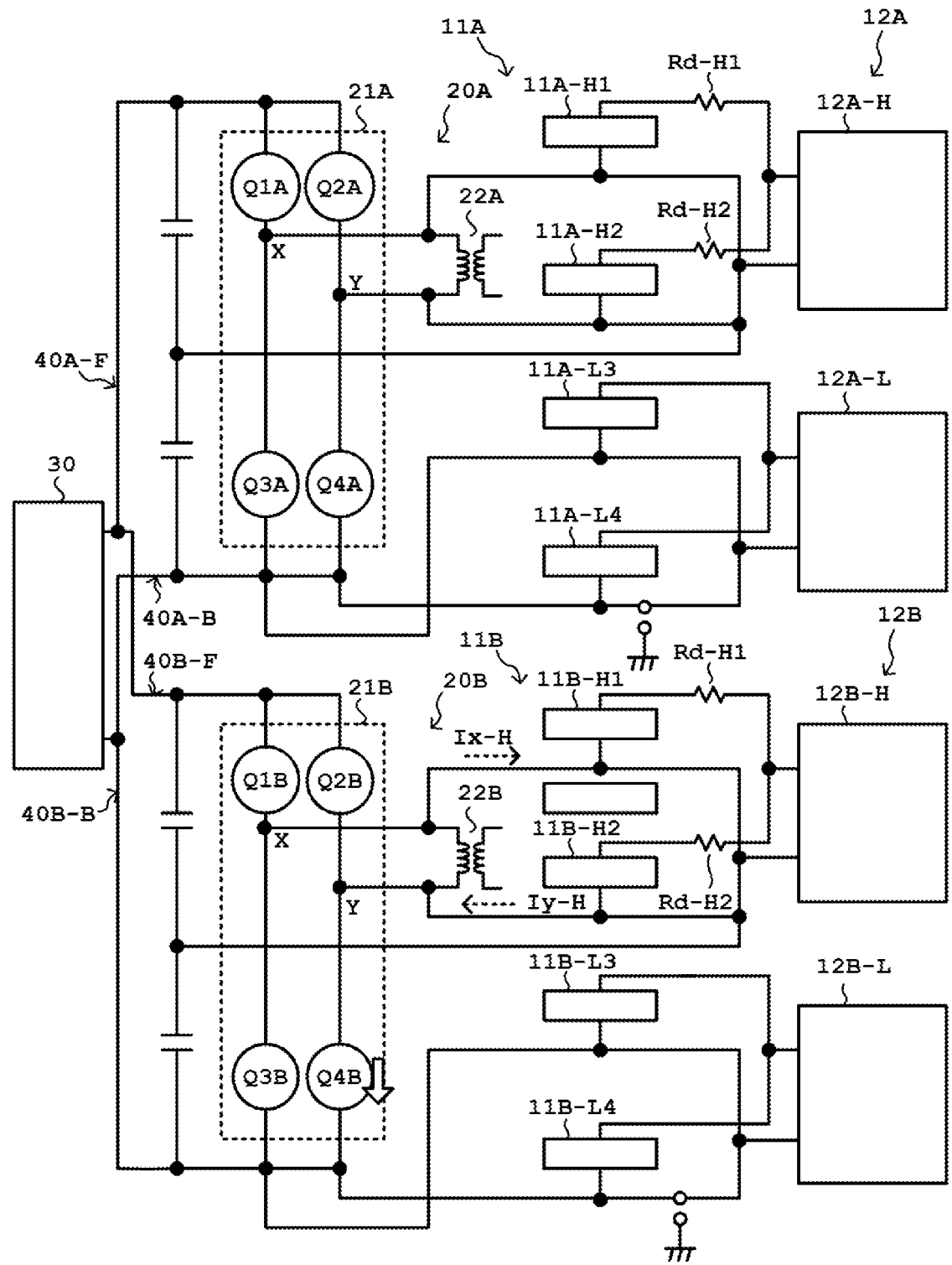
FIG. 8 is a schematic block diagram illustrating a second configuration of the driver device in the class-D full bridge amplifier according to the invention.

FIG. 8 shows a configuration example in which two class-D full bridge amplifiers 20A and 20B are parallel-connected to a DC power supply 30.

In the second configuration, the class-D full bridge amplifiers 20A and 20B may be configured in such a way that low voltage parts of high-side driver circuits are connected in terms of direct current with respect to a reference potential as with the case of the first configuration, or may be configured in such a way that damping resistances are connected to high voltage parts of the high-side driver circuits.

The configuration example in FIG. 8 shows a configuration having the damping resistances connected to the high voltage parts of the high-side driver circuits.

The class-D full bridge amplifier 20A and the class-D full bridge amplifier 20B perform power conversion on DC voltages in the DC power supply 30, so that each of the class-D full bridge amplifiers is driven by a driver power supply separately provided.

The class-D full bridge amplifier 20A includes a full bridge circuit 21A and a driver circuit 11A. The driver circuit 11A includes two high-side driver circuits 11A-H1, 11A-H2 and two low-side driver circuits 11A-L3, 11A-L4, the driver circuits driving high-side switching elements Q1, Q2 and low-side switching elements Q3, Q4 of the full bridge circuit 21A, respectively.

Correspondingly, the driver circuit 11B includes two high-side driver circuit 11B-H1, 11B-H2 and two low-side driver circuit 11B-L3, 11B-L4, the driver circuits driving high-side switching elements Q1, Q2 and low-side switching elements Q3, Q4 of the full bridge circuit 21B, respectively.

The driver circuit 11A and the driver circuit 11B include each independent driver power supply 12A and driver power supply 12B. The driver power supply 12A includes a high-side driver power supply 12A-H for supplying power to the high-side driver circuits 11A-H1, 11A-H2 and a low-side driver power supply 12A-L for supplying power to the low-side driver circuits 11A-L3, 11A-L4. Correspondingly, the driver power supply 12B includes a high-side driver power supply 12B-H for supplying power to the high-side driver circuits 11B-H1, 11B-H2 and a low-side driver power supply 12B-L for supplying power to the low-side driver circuits 11B-L3, 11B-L4.

The power supply to the low-side driver circuits 11A-L3, 11A-L4 of the driver circuit 11A and the low-side driver circuits 11B-L3, 11B-L4 of the driver circuit 11B may be implemented by a common driver power supply.

For example, the low-side driver power supply 12B-L may be omitted, and the low-side driver power supply 12A-L is used as common driver power supply.

(2) Operation Example:

An operation example of the second configuration will be described by referring to FIG. 9. In here, the description is about an operation example for a case where a delay operation is occurred in the low-side switching element Q4 of the class-D full bridge amplifier 20B.

The delay operation occurred in the low-side switching element Q4 of the class-D full bridge amplifier 20B causes an ON time in the low-side switching element Q4 to fall behind a predetermined time (S41).

In here, a midpoint potential M is not VDD/2 on the high side of the class-D full bridge amplifier 20B, and a DC voltage component is generated at the point Y seen from the midpoint potential M (S42).

Then, a DC cross current Iy-H flows from the high-side driver circuit 11B-H2 toward the point Y in the full bridge circuit 21B, and a DC cross current Ix-H flows from a point X in the full bridge circuit 21B toward the high-side driver circuit 11B-H1 (S43).

The driver power supply 12A and the driver power supply 12B are separated without being connected, and a closed circuit consisting of a DC power supply, the class-D full bridge amplifier and the driver power supply is not formed. Thus, voltages at the point X and the point Y of the class-D full bridge amplifier 20A is not affected by voltage fluctuation at the point X and the point Y of the class-D full bridge amplifier 20B (S44).

Since the cross current Ix-H and the cross current Iy-H generated on the high side of the class-D full bridge amplifier 20B do not flow to the class-D full bridge amplifier 20A via the driver power supply, the cross current Ix-H and the cross current Iy-H do not flow through the class-D full bridge amplifier 20A (S45).

Since the voltage fluctuation does not occur at the point X and the point Y and the cross current Ix-H and the cross current Iy-H do not flow in the class-D full bridge amplifier 20A, power source currents flowing through a forward path 40A-F and a backward path 40A-B between the DC power supply 30 and the class-D full bridge amplifier 20A are even to each other, and power source currents flowing through the forward path 40A-F and a backward path 40B-B between the DC power supply 30 and the class-D full bridge amplifier 20B are also even to each other (S46).

(3) Example of Applying to N-Number of Class-D Full Bridge Amplifiers:

As a configuration having a plurality of class-D full bridge amplifiers parallel-connected to a DC power supply, FIG. 8 shows a schematic configuration for a case of applying to two class-D full bridge amplifiers. The second configuration can be applied not only to the configuration with the two class-D full bridge amplifiers but also to N-number of class-D full bridge amplifiers for connecting the amplifiers in parallel. FIG. 10 shows a schematic configuration for a case of applying to the N-number of class-D full bridge amplifiers.

A plurality of class-D full bridge amplifiers 20A to 20N are arranged in parallel to the DC power supply 30, and the amplifiers include full bridge circuits 21A to 21N and driver devices 10A to 10N, respectively.

The driver devices 10A to 10N include driver circuits 11A to 11N for driving the full bridge circuits 21A to 21N, respectively, and the driver circuits 11A to 11N are individually provided with driver power supplies 12A to 12N. To low-side driver circuits, power can be supplied from a common driver power supply.

By providing the driver power supplies 12A to 12N respectively to the class-D full bridge amplifiers 20A to 20N, the plurality of class-D full bridge amplifiers 20A to 20N do not form their respective closed circuits via the driver power supplies 12A to 12N, and thus, even if a delay operation occurs in a switching element of any of the class-D full bridge amplifiers, the other class-D full bridge amplifiers are not affected by the voltage fluctuation, the cross current or so.

A comparative configuration example of the second configuration implements power supply to the driver circuits of the plurality of class-D full bridge amplifiers by using a common driver power supply. FIG. 11 shows a configuration in which two power conversion devices 101A and 101B are provided in parallel to a DC power supply 130, and a common driver power supply 112 is provided to the power conversion devices 101A, 101B. Of two power conversion devices 101A, 101B, the following description takes the power conversion device 101A as an example.

The power conversion device 101A uses a bridge circuit 121A included in a class-D amplifier 120A to perform power conversion on a DC voltage in the DC power supply 130, thereby outputting an AC voltage from an output transformer 122A.

The bridge circuit 121A has high-side switching elements Q1 and Q2 that forms a chopper circuit and are driven by driver voltages Va-H, Vb-H applied by high-side driver circuits 111-H1 and 111-H2 connected to a high-side driver power supply 112-H.

Low-side switching elements Q3 and Q4 are driven by driver voltages Va-L and Vd-L applied by low-side driver circuits 111-L3 and 111-L4 connected to a high-side driver power supply 112-L.

In the figure, there are a midpoint A in a series circuit consisting of the high-side switching element Q1 and the low-side switching element Q3 which form one of legs of the bridge circuit 121A, a midpoint B in a series circuit consisting of the high-side switching element Q2 and the low-side switching element Q4 which form the other leg of the bridge circuit 121A, a midpoint C in a series circuit consisting of a high-side switching element Q1 and a low-side switching element Q3 which form one of legs of a bridge circuit 121B, and a midpoint D in a series circuit consisting of a high-side switching element Q2 and a low-side switching element Q4 which form the other leg of the bridge circuit 121B.

A power conversion device 101B has the same configuration, in which a driver circuit 111B is connected with the driver power supply 112 which is shared with the driver circuit 111A.

Figure 12:
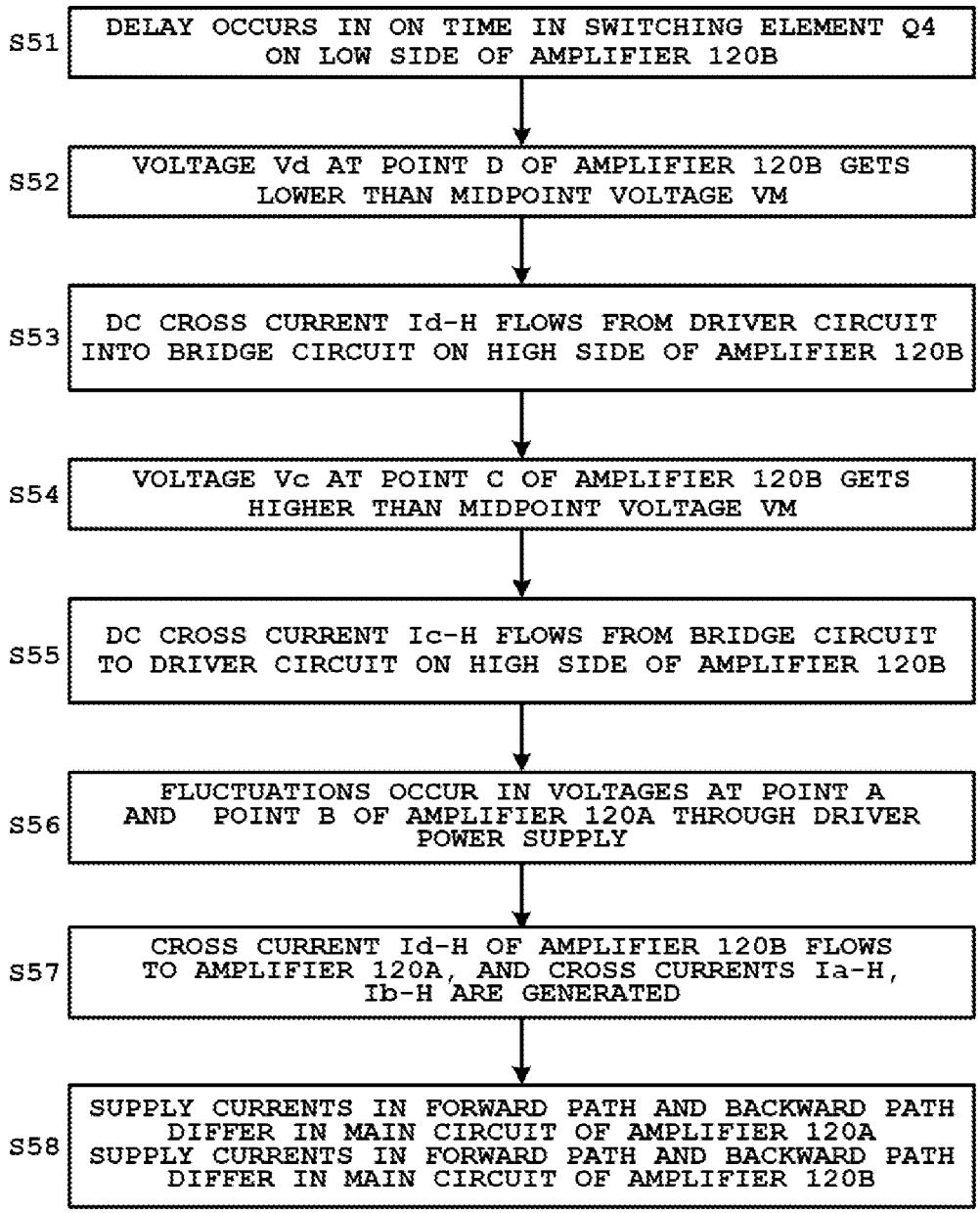
FIG. 12 is a flowchart illustrating an operation example of the comparative configuration example in the second configuration of the driver device in the class-D full bridge amplifier according to the invention.

In a flowchart of an operation shown in FIG. 12, in a case where an ON state lasts longer than a steady state due to a delay operation in a low-side switching element Q4 of a class-D amplifier 120B (S51), a voltage Vd at a point D in the class-D amplifier 120B becomes lower than a voltage VM at a midpoint M in the DC power supply 130 (S52). Since there is a voltage difference between the voltage Vd and the voltage VM at the midpoint M, a DC cross current Id-H flows from a high-side driver circuit 111B-H2 of the class-D amplifier 120B toward a bridge circuit 121B (S53).

By contrast, a voltage Vc at a point C in the class-D amplifier 120B becomes higher than the voltage VM at the midpoint M in the DC power supply 130 (S54). Consequently, a DC cross current Ic-H flows from the bridge circuit 121B toward a high-side driver circuit 111B-H1 of the class-D amplifier 120B (S55).

There are fluctuations in a voltage Va at a point A and a voltage Vb at a point B in the class-D amplifier 120A affected by fluctuations in the voltage Vc at the point C and the voltage Vd at the point C in the class-D amplifier 120B via the common driver power supply 112. The fluctuations in the voltages Va, Vb, Vc and Vd at the points A, B, C and D, respectively, cause unevenness in a current in the driver power supply and a current flowing through the driver circuit and further in the driver voltages, leading to difficulty in normal driving conditions (S56).

Furthermore, in the class-D amplifier 120B, a cross current Ic-H and a cross current Id-H flow to the class-D amplifier 120A via a main circuit 140A between the DC power supply 130 and the class-D amplifier 120A and a main circuit 140B between the DC power supply 130 and the class-D amplifier 120B, respectively, and thereby a cross current Ia-H and a cross current Ib-H are generated in the class-D amplifier 120A (S57).

The generation of the cross current Ia-H and the cross current Ib-H causes a difference between a forward current flowing through a forward path 140B-F and a backward current flowing through a backward path 140A-B in the main circuit 140B of the class-D amplifier 120B, and the generation of the cross current Ic-H and the cross current Id-H causes a difference between a forward current flowing through a forward path 140A-F and a backward current flowing through a backward path 140A-B in the main circuit 140A of the class-D amplifier 120A (S58). If there is a difference in inflow and outflow currents between each class-D amplifier and the DC power supply, there is a problem that measurement of input/output power in the class-D amplifier becomes difficult.

<Circuit Example>

Circuit Examples 1 and 2 of the invention will now be described by referring to FIGS. 13 and 14.

Figure 13:
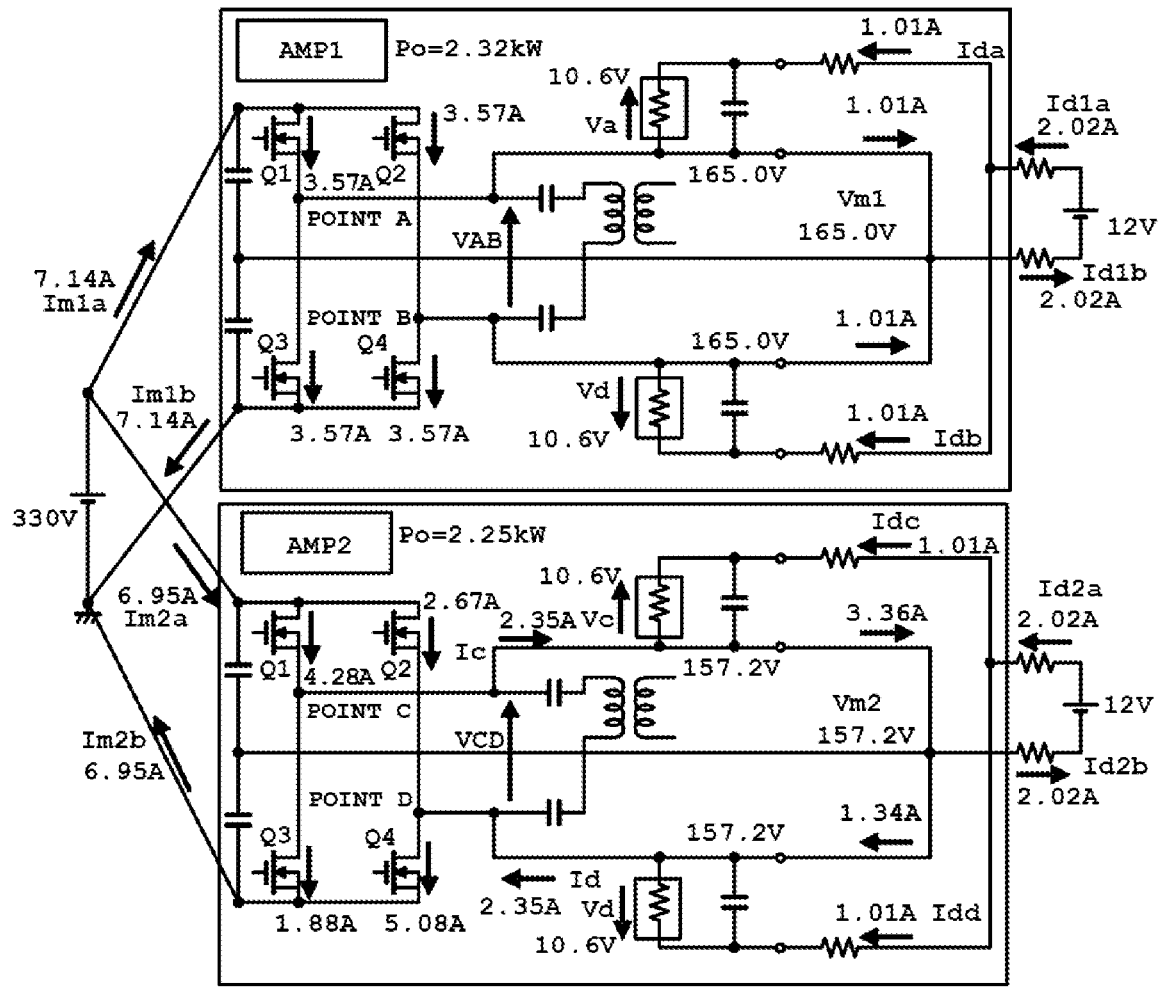
FIG. 13 is Circuit Example 1 of the driver device in the class-D full bridge amplifier according to the invention.
Figure 14:
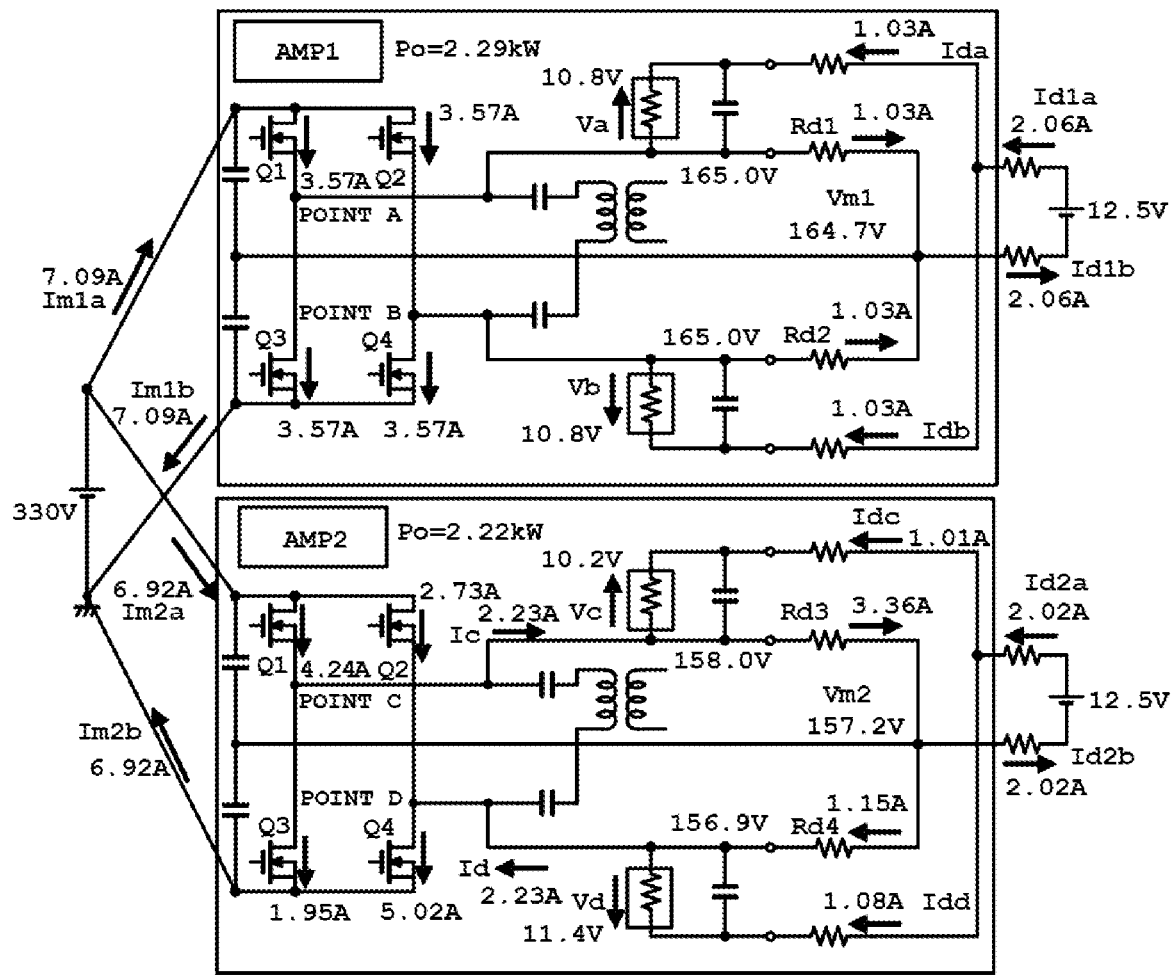
FIG. 14 is Circuit Example 2 of the driver device in the class-D full bridge amplifier according to the invention.

FIGS. 13 and 14 show circuit examples according to Circuit Examples 1 and 2, respectively, in which driver circuits are shown only on the high side, whereas those on the low side are omitted. Voltage values and current values shown in the figures are some examples by simulations, and the invention is not limited to these values.

Circuit Example 1 of the invention has a first configuration in which reference potentials are equipotential in terms of direct current on the low voltage parts of two high-side driver circuits that drive respective two high-side switching elements among four switching elements which form a full bridge circuit of a class-D full bridge amplifier, and a second configuration in which a driver power supply is provided to each driver circuit in a configuration for driving a plurality of class-D full bridge amplifiers by a single DC power supply as a reference power supply, instead of sharing the single driver power supply among the driver circuits that drive corresponding class-D full bridge amplifiers. These figures show operation examples for a case where a delay operation occurs in a low-side switching element Q4 of an amplifier AMP2.

Since the first configuration allows a class-D full bridge amplifier AMP1 to operate normally, no cross current is generated, and consequently a driver current flowing through the driver circuit, a driver voltage and a supply current flowing from the driver power supply into the driver circuit are even. On the other hand, a cross current is generated in the class-D full bridge amplifier AMP2 where the delay operation in the element occurs. However, the low voltage parts of the high-side driver circuits are directly connected to have the same potential, so that the driver current flowing through the driver circuit, the driver voltage and the supply current flowing from the driver power supply into the driver circuit are even.

Since the second configuration prevent formation of a closed circuit of a path that connects the class-D full bridge amplifier AMP1 and the class-D full bridge amplifier AMP2 via the DC power supply and the driver power supply, even when a cross current is generated in one of these class-D full bridge amplifiers, the cross current is inhibited to flow into the other class-D full bridge amplifier, and thereby no difference occurs in inflow and outflow currents between the class-D amplifiers and the DC power supply.

Circuit Example 2 of the invention has the second configuration in which the driver power supply is provided to each driver circuit in the configuration for driving the plurality of class-D full bridge amplifiers by the single DC power supply as a reference power supply, instead of sharing the single driver power supply among the driver circuits that drive corresponding class-D full bridge amplifiers.

By contrast, as to the first configuration, the two high-side driver circuits respectively driving two high-side switching elements among four switching elements, which form the full bridge circuit of the class-D full bridge amplifier, have their low voltage parts connected to the reference potentials via damping resistances, so that they are not equipotential in terms of direct current.

According to Circuit Example 2 of the invention, the second configuration prevents the formation of the closed circuit of the path that connects the class-D full bridge amplifier AMP1 with the class-D full bridge amplifier AMP2 via the DC power supply and the driver power supply, so that even when a cross current is generated in one of the class-D full bridge amplifiers, the cross current is inhibited to flow into the other class-D full bridge amplifier, and thereby no difference occurs in the inflow and outflow currents between the class-D amplifiers and the DC power supply.

On the other hand, since Circuit Example 2 does not have the first configuration, cross currents Ic and Id are generated between a bridge circuit and a driver circuit in a class-D full bridge amplifier in which a delay operation occurs in its switching element, and thus a difference occurs between driver currents Idc and Idd, causing unevenness in driver voltages Vc and Vd.

Figure 15:
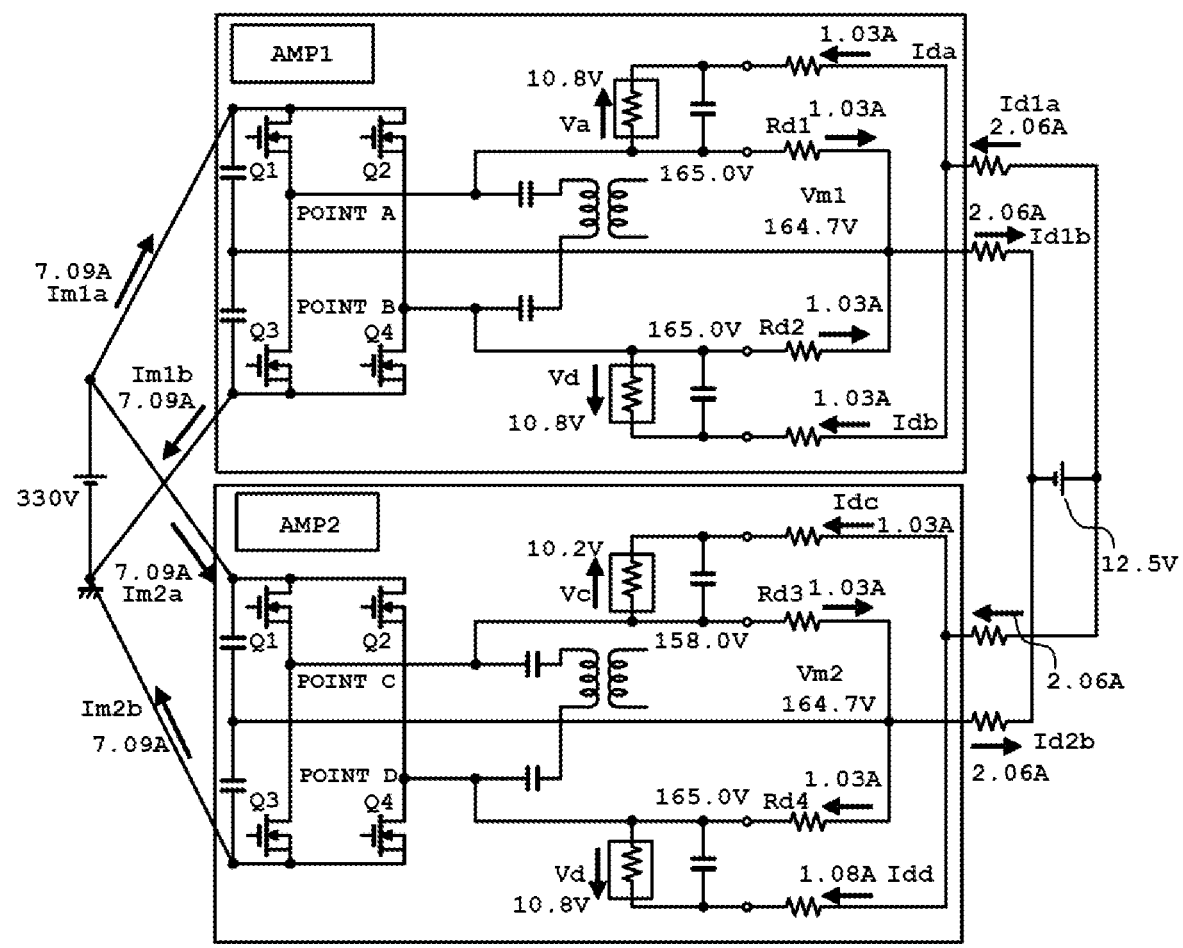
FIG. 15 is a comparative circuit example of the driver device in the class-D full bridge amplifier according to the invention.
Figure 16:
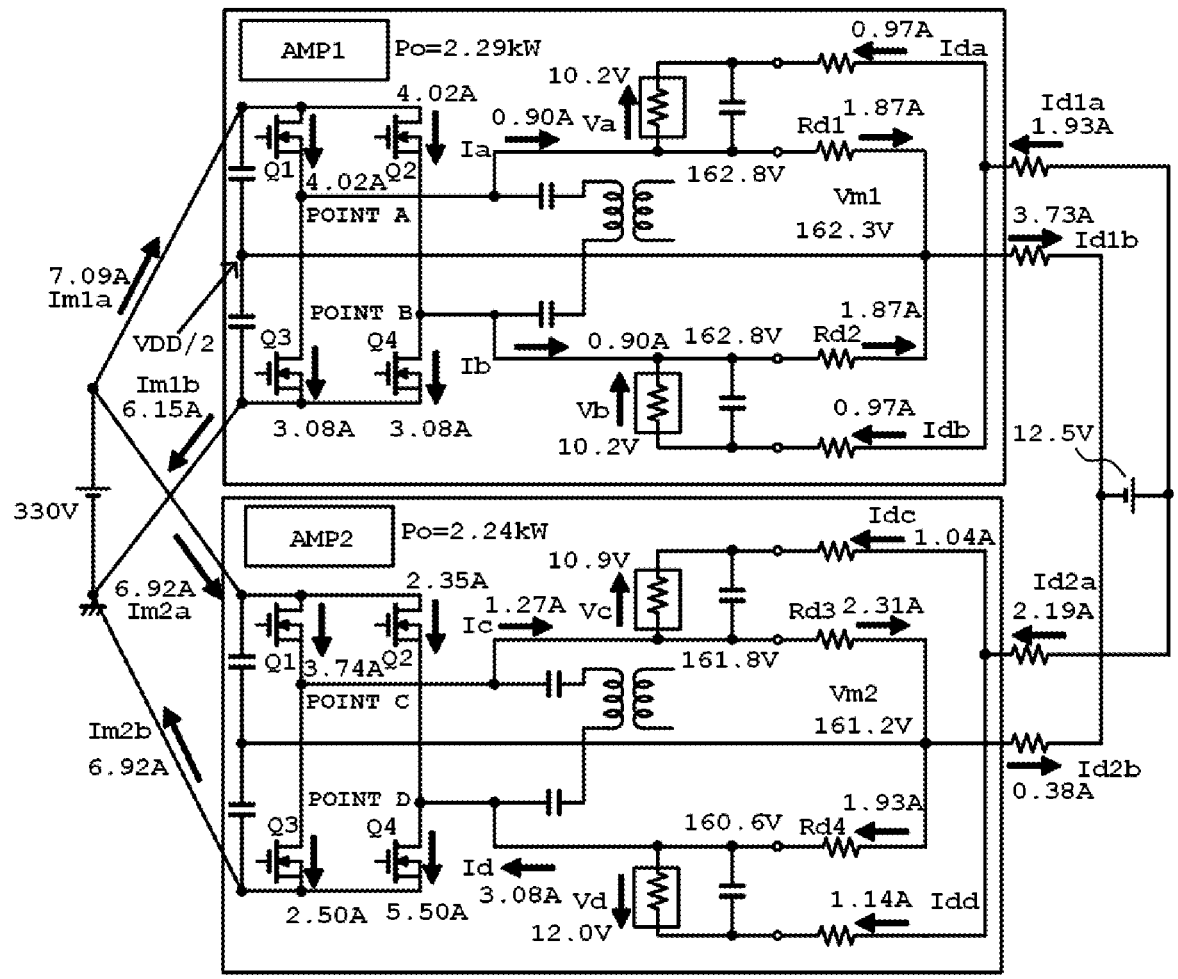
FIG. 16 is another comparative circuit example of the driver device in the class-D full bridge amplifier according to the invention.
Figure 17:
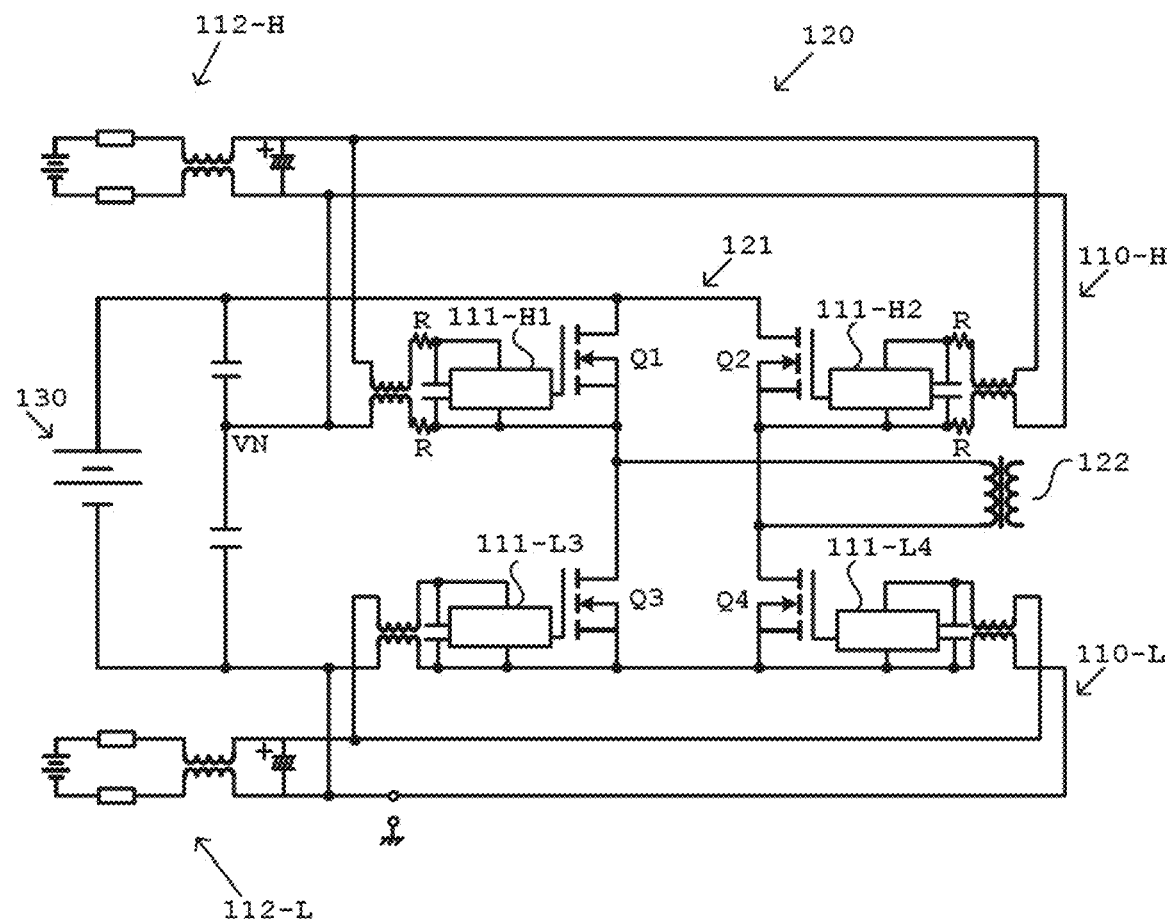
FIG. 17 is a configuration example of a power conversion device using a class-D full bridge amplifier.

A circuit configuration that does not have the second configuration of the invention will be presented as a comparison circuit example below. The comparison circuit example has a configuration in which driver circuits for driving a plurality of class-D full bridge amplifiers share a single driver power supply. FIG. 15 shows a state where switching elements operate normally, and FIG. 16 shows a state where a delay operation has occurred in one of switching elements of a class-D full bridge amplifier AMP2.

In the normal state, a driver current flowing through the driver circuit, a supply current flowing from the driver power supply into each class-D full bridge amplifier and a driver voltage in the driver circuit are even in each class-D full bridge amplifier.

By contrast, when a delay operation occurs in a gate signal of a low-side switching element Q4 of the class-D full bridge amplifier AMP2 and thus an ON state falls behind a predetermined time, for instance, a potential at a point D in the class-D full bridge amplifier AMP2 becomes lower than a midpoint voltage VDD/2 of a DC power supply, and thereby a DC cross current Id flows from the driver circuit toward a bridge circuit. On the other hand, since there is no delay in a low-side switching element Q3, a potential at a point C becomes higher than the midpoint voltage VDD/2 of the DC power supply, and thereby a DC cross current Ic flows from the bridge circuit toward the driver circuit.

The decrease in the potential at the point D leads to fluctuations in potentials at the points A and B in a class-D full bridge amplifier AMP1 via a common driver power supply.

The DC cross current Id generated in the full bridge amplifier AMP2 flows into the full bridge amplifier AMP1 via a forward path from the full bridge amplifier AMP2 to the DC power supply and a backward path from the DC power supply to the full bridge amplifier AMP1, and thereby cross currents Ia and Ib are generated in the full bridge amplifier AMP1.

It causes differences between forward currents and backward currents in a main circuit between the DC power supply and the full bridge amplifier AMP1 and a main circuit between the DC power supply and the full bridge amplifier AMP2, causing difficulty in input/output power measurement on each full bridge amplifier.

The above embodiments and variations are a few examples of the pulsed high-frequency monitor of the present invention, and the invention is not limited thereto. Thus, the present invention can be modified in various ways based on the gist of the invention, which modifications are not excluded from the scope of the present invention.

INDUSTRIAL APPLICABILITY

The driver device of the class-D full bridge amplifier of the present invention can be applied to a high-frequency power supply (RF generator) to be used for semiconductor manufacturing equipment, liquid crystal panel manufacturing equipment and others.

REFERENCE SIGNS LIST

10 Driver Device
11 Driver Circuit
11-H1, 11-H2 High-Side Driver Circuit
11-L3, 11-L4 Low-Side Driver Circuit
12 Driver Power Supply
12-H High-Side Driver Power Supply
12-L Low-Side Driver Power Supply
20 Class-D Bridge Amplifier
21 Full Bridge Circuit
22 Output Transformer
30 DC Power Supply
110-H High-Side Driver Device
110-L Low-Side Driver Device
111-H1, 111-H2 High-Side Driver Circuit
111-L3, 111-L4 Low-Side Driver Circuit
112 Driver Power Supply
112-H High-Side Driver Power Supply
112-L Low-Side Driver Power Supply
121 Bridge Circuit
130 DC Power Supply

The invention claimed is:

1. A driver device of a class-D full bridge amplifier that includes a full bridge circuit consisting of four switching elements of two high-side switching elements and two low-side switching elements to drive switching elements in the class-D full bridge amplifier for performing power conversion on a DC voltage of a DC power supply, comprising:
(A) a driver circuit that drives the switching element; and
(B) a driver power supply that applies a voltage to the driver circuit, wherein the driver circuit comprises:
(A1) two high-side driver circuits that drive the two high-side switching elements; and
(A2) two low-side driver circuits that drive the two low-side switching elements, and the driver power supply comprises:
(B1) a high-side driver power supply that applies driver voltages to the two high-side driver circuits; and
(B2) a low-side driver power supply that applies driver voltages to the two low-side driver circuits,
in the two high-side driver circuits
(a) high voltage parts being connected to a high voltage part of the high-side driver power supply,
(b) low voltage parts being connected to a low voltage part of the high-side driver power supply,
(c) potentials on the low voltage parts being equipotential in terms of direct current with respect to a reference potential which is isolated from a ground potential, (d) a potential at a midpoint in one series circuit formed by the high-side switching element and the low-side switching element and a potential at a midpoint in the other series circuit formed by the other high-side switching element and the other low-side switching element being equipotential in the full bridge circuit.

2. The driver device of the class-D full bridge amplifier according to claim 1, wherein the driver power supply is provided on an individual basis to each of a plurality of class-D full bridge amplifiers connected in parallel to the DC power supply.

3. The driver device of the class-D full bridge amplifier according to claim 1, wherein the reference potential in terms of direct current is a potential at a midpoint between a high voltage part and a low voltage part of the DC power supply, and the low voltage parts of the two high-side driver circuits are connected to the midpoint directly or via inductances.

4. The driver device of the class-D full bridge amplifier according to claim 1, wherein the reference potential in terms of direct current is potential at an output terminal of the class-D full bridge amplifier, and the low voltage parts of the two high-side driver circuits are connected to the output terminal of the class-D full bridge amplifier directly or via the inductances.

5. The driver device of the class-D full bridge amplifier according to claim 1, wherein the reference potential in terms of direct current is a potential of a reference power supply isolated from the ground potential, and the low voltage parts of the two high-side driver circuits are connected to the reference power supply directly or via the inductances.

* * * * *